(12) United States Patent
Pala et al.

(10) Patent No.: US 11,545,585 B2
(45) Date of Patent: Jan. 3, 2023

(54) SINGLE SIDED CHANNEL MESA POWER JUNCTION FIELD EFFECT TRANSISTOR

(71) Applicant: MONOLITHIC POWER SYSTEMS, INC., San Jose, CA (US)

(72) Inventors: Vipindas Pala, San Jose, CA (US); Sudarsan Uppili, Portland, OR (US)

(73) Assignee: MONOLITHIC POWER SYSTEMS, INC., San Jose, CA (US)

( * ) Notice: Subject to any disclaimer, the term of this patent is extended or adjusted under 35 U.S.C. 154(b) by 202 days.

(21) Appl. No.: 16/999,942

(22) Filed: Aug. 21, 2020

(65) Prior Publication Data
US 2022/0059706 A1   Feb. 24, 2022

(51) Int. Cl.
| | | |
|---|---|---|
| H01L 29/78 | (2006.01) | |
| H01L 29/808 | (2006.01) | |
| H01L 21/04 | (2006.01) | |
| H01L 29/10 | (2006.01) | |
| H01L 29/66 | (2006.01) | |
| H01L 29/16 | (2006.01) | |

(52) U.S. Cl.
CPC ........ H01L 29/8083 (2013.01); H01L 21/047 (2013.01); H01L 29/1058 (2013.01); H01L 29/1608 (2013.01); H01L 29/66068 (2013.01); H01L 29/7802 (2013.01)

(58) Field of Classification Search
CPC ............. H01L 29/1066; H01L 29/7827; H01L 29/7828; H01L 29/8083; H01L 21/047; H01L 21/26586; H01L 29/0657; H01L 29/0692; H01L 29/1058; H01L 29/1608; H01L 29/2003; H01L 29/66068; H01L 29/7802

See application file for complete search history.

(56) References Cited

U.S. PATENT DOCUMENTS

| | | | |
|---|---|---|---|
| 4,952,990 A * | 8/1990 | Gruning | H01L 29/7391 257/107 |
| 5,903,020 A | 5/1999 | Siergiej et al. | |
| 6,767,783 B2 | 7/2004 | Casady et al. | |
| 7,479,672 B2 | 1/2009 | Zhao | |
| 10,074,741 B2 | 9/2018 | Aichinger et al. | |

(Continued)

FOREIGN PATENT DOCUMENTS

JP   5829975 B2   12/2015

OTHER PUBLICATIONS

International Search Report and Written Opinion of the International Searching Authority for PCT Application No. PCT/US21/46257, dated Jan. 11, 2022, 12 sheets.

*Primary Examiner* — Eric A. Ward
(74) *Attorney, Agent, or Firm* — Beyer Law Group LLP

(57) ABSTRACT

Junction field effect transistors (JFETs) and related manufacturing methods are disclosed herein. A disclosed JFET includes a vertical channel region located in a mesa and a first channel control region located on a first side of the mesa. The first channel control region is at least one of a gate region and a first base region. The JEFT also includes a second base region located on a second side of the mesa and extending through the mesa to contact the vertical channel region. The vertical channel can be an implanted vertical channel. The vertical channel can be asymmetrically located in the mesa towards the first side of the mesa.

13 Claims, 16 Drawing Sheets

(56) References Cited

U.S. PATENT DOCUMENTS

| | | | |
|---|---|---|---|
| 2005/0161732 A1* | 7/2005 | Mizukami | H01L 29/0634 |
| | | | 257/E29.313 |
| 2007/0012946 A1 | 1/2007 | Sankin et al. | |
| 2014/0015036 A1* | 1/2014 | Fursin | H01L 29/7828 |
| | | | 257/329 |
| 2014/0175460 A1 | 6/2014 | Veliadis | |
| 2014/0264562 A1 | 9/2014 | Cheng et al. | |
| 2014/0361349 A1 | 12/2014 | Alexandrov et al. | |
| 2016/0336432 A1 | 11/2016 | Bhalla et al. | |
| 2016/0380117 A1* | 12/2016 | Bhalla | H01L 29/0657 |
| | | | 257/77 |
| 2017/0125574 A1 | 5/2017 | Chowdhury et al. | |

* cited by examiner

SINGLE SIDED CHANNEL MESA POWER JUNCTION FIELD EFFECT TRANSISTOR

BACKGROUND

Junction field effect transistors (JFETs) operate by providing a conductive path between a drain and source terminal through a channel of the device in response to the application of a voltage to a third terminal. The third terminal is a channel control terminal such as a gate or base terminal. Four terminal JFETS can include both a gate terminal and a base terminal. The third terminal can be referred to as a channel control terminal because when an appropriate bias voltage(s) is applied to the gate and/or base, the characteristics of the channel are altered, current flows through the channel between the source and drain, and the transistor is ON. Accordingly, when an opposite bias voltage(s) is applied to the gate and/or base, the channel of the device is pinched off and the transistor is OFF. The bias voltages depend on the conductivity types (e.g., n-type or p-type) of the various regions and whether the transistor is a nominally ON or nominally OFF device.

Traditional JFETs are lateral devices in which the main direction of current flow through the channel is parallel to the surface of the substrate on which the device is formed. Vertical JFETs, in contrast, are devices in which the main direction of current flow through the device is perpendicular to the surface of the substrate. The drain of a vertical JFET can be the substrate itself with current flowing from wiring layers above the active semiconductor layer of the substrate and down into the substrate.

FIG. 1 provides two cross sections 100 and 150 taken from different types of vertical JFET devices. Both illustrated cross sections are taken from mesa vertical JFET devices, which are referred to as such because the vertical channels of both devices are formed in mesas of active material (i.e., mesa 101 and mesa 151). Mesa vertical JFET devices are also, in some cases, referred to as trench vertical JFETs. The devices are also similar in that current ultimately flows from a source contact 102/152 and a source region 103/153 through a drift region 104/154 to a drain region 105/155. As mentioned, the drain region can be the substrate on which the device is built. The devices are also similar in that this current flow is controlled through the application of a bias voltage to two sets of base contacts 106/156 and 107/157 and two sets of base regions 108/158 and 109/159. The application of an appropriate bias voltage can serve to allow current to flow through a channel of the device or to pinch off the channel by depleting it of majority carriers. As stated above, depending upon the conductivity type of the channel of the devices, this bias voltage can be positive or negative with respect to the alternative regions of the device.

The devices illustrated by cross sections 100 and 150 differ in the characteristics of their channel regions. In these figures, and throughout this disclosure, solid black regions indicate ohmic contact material (e.g., metal wires), hatched regions indicate semiconductor material of a first conductivity type (e.g., n-type doped semiconductor material) and dotted regions indicate semiconductor material of a second conductivity type which is opposite the first (e.g., p-type doped semiconductor material). Darker semiconductor areas indicate higher levels of majority carriers (e.g., darker n-type regions are more n-type and darker p-type regions are more p-type). The device illustrated by cross section 100 incudes a channel region 110 which has been formed in an epitaxial layer of material that itself was formed over drift region 104. The channel can be pinched off by applying the appropriate voltage to the base regions 108 and 109 to deplete the channel region 110 from majority carriers and thereby prevent the flow of current from source region 103 down to drain region 105. One problem with this type of device is that the variation of the cumulative channel dopant dose in the epitaxial layer in which channel region 110 is formed can be as high as +/−20% in certain manufacturing environments. The source of this variation could be from the variation doping concentration in the channel layer or from the variation in mesa width leading to variation in width of the channel region. The device illustrated by cross section 150 attempts to address this concern by forming two separate channel regions 160 and 161 by implanting dopants into a neutral or lightly doped semiconductor layer 162. The resulting device can exhibit certain benefits in that dopant variation in layers formed through the implantation of dopants can be as low as +/−3% in certain manufacturing environments. As a result, the characteristics of the devices illustrated by cross section 150 can ostensibly be better controlled and more consistent across a given chip, wafer, or production line.

SUMMARY

Methods and devices related to the field of semiconductor transistors are disclosed herein. The devices can be vertical junction field effect transistors (JFETs). The methods can include methods for fabricating devices which exhibit superior performance and manufacturability characteristics as compared to prior art approaches. Although the methods and devices disclosed herein are applicable to various applications, in specific embodiments the devices can be vertical JFETs designed for high power applications. In specific embodiments, the devices can be mesa vertical JFETs with reliable device characteristics that are less susceptible to manufacturing variations in the width of their mesas as compared to prior art approaches.

In specific embodiments of the invention, a JFET is provided which comprises a vertical channel region located in a mesa and a first channel control region located on a first side of the mesa. The channel control region is at least one of a gate region and a base region. As used herein, the term "base region" refers to a region of opposite conductivity type to the channel region which, in response to the appropriate bias voltage or current, is capable of depleting the channel region. As used herein, the term "gate region" refers to a region which, in response to the appropriate bias voltage, is capable of depleting the channel region. The gate region can include a gate insulator and a gate electrode. The JFET also comprises a second base region located on a second side of the mesa and extending through the mesa to contact the vertical channel region. In specific embodiments, the vertical channel region of the JFET can be an implanted vertical channel region. In specific embodiments, the second base region can have a low doped portion and a high doped portion where the high doped portion is located on a second side of the mesa and the low doped portion extends from the high doped portion to contact the vertical channel region. As used herein the term "contact" when used with reference to the relationship of two regions refers to the regions being physically adjacent (i.e., touching). The term is not meant to refer to a resistive electrical connection. Indeed, those of ordinary skill in the art will recognize that a base region and channel region which are in contact form a p-n junction.

In specific embodiments of the invention, a method of forming a JFET is provided. The method comprises forming a mesa on a substrate which includes a first layer with a first conductivity type and a second layer with a second conductivity type. The first and second conductivity types are opposite. The method also comprises forming, after forming the mesa, a vertical channel for the JFET on a first side of the mesa in the second layer. The vertical channel has the first conductivity type.

DETAILED DESCRIPTION

Methods and systems related to the field of semiconductor transistors in accordance with the summary above are disclosed in detail herein. The methods and systems disclosed in this section are nonlimiting embodiments of the invention, are provided for explanatory purposes only, and should not be used to constrict the full scope of the invention.

Specific implementations of the junction field effect transistors (JFETs) disclosed herein can be used in various applications. For example, the JFETs disclosed herein can be used as power transistors. The power transistors can be used in power factor correction (PFC) circuits, all manner of power converters (e.g., AC-AC, DC-AC, etc.), motor drive circuits, and other high power applications known to those of ordinary skill in the art. The power transistors can be used in power supply circuits for enterprise grade data center infrastructure applications, electric vehicle power supplies, high energy microwave generators such as in inverter-less microwave ovens, and other high power applications known to those of ordinary skill in the art. Specific implementations can include power transistors with hold off voltages in the hundreds of volts range and ON currents on the order of amperes or tens of amperes.

Specific implementations of the JFETs disclosed herein can utilize various semiconductor materials. For example, the JFETs can be fabricated using various III-IV materials such as gallium nitride or silicon carbide as the base semiconductor materials. In the case of silicon carbide, the dopants can include aluminum or boron as a p-type dopant and phosphorous or nitrogen as an n-type dopant. In the case of gallium nitride, the dopants can include magnesium as a p-type dopant and silicon or oxygen as an n-type dopant. The various regions of material disclosed herein can therefore be formed in various semiconductor materials such as silicon carbide, and be activated to form active regions such as channel, channel control, drain, and source regions, through the introduction of a compatible dopant species for the selected semiconductor material.

Figure 2:
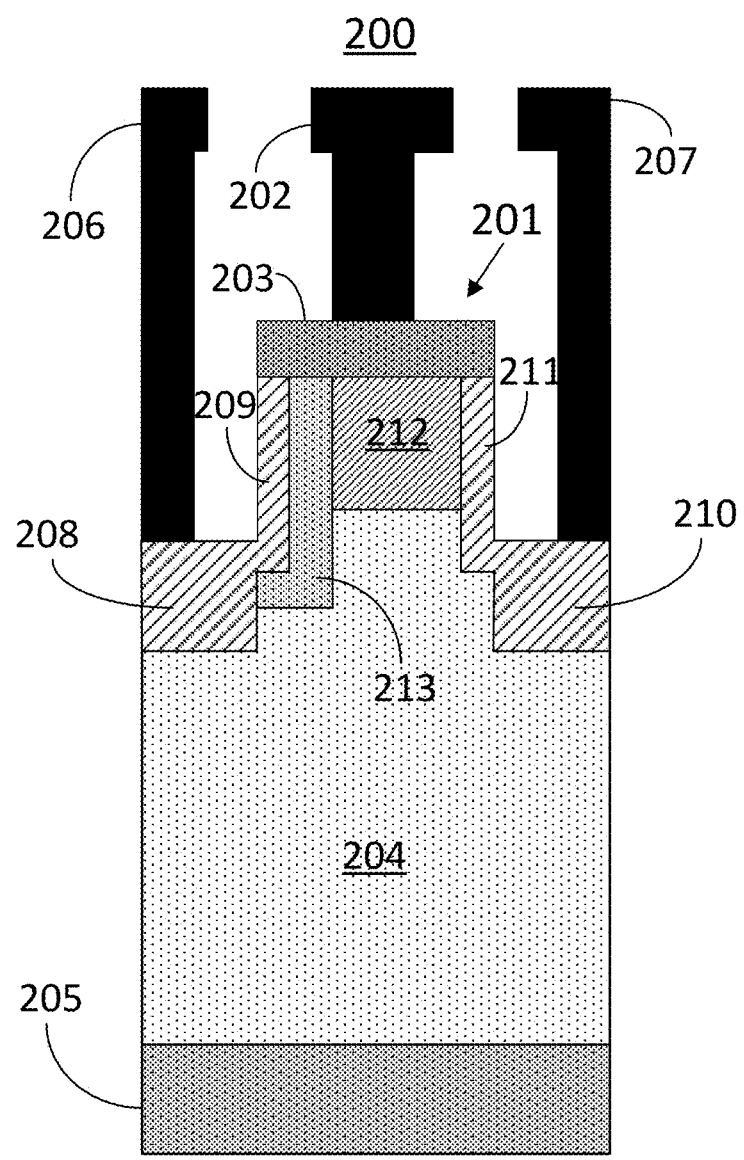
FIG. 2 illustrates a cross section taken from a vertical JFET device in accordance with specific embodiments of the invention disclosed herein.

Specific implementations of the JFETs disclosed herein can take on various forms and should not be constrained by the illustrated cross sections which are provided for purposes of illustration only. For example, FIG. 2 provides a cross section 200 of a single mesa, but the illustrated mesa may be a single cell in a multi-mesa device where each mesa shares electrically connected channel control, drain, and/or source regions. Furthermore, although FIG. 2 illustrates source layer 203 located on a top side of mesa 201 and a drain layer 205 located below mesa 201 where the implanted vertical channel region 213 provides a conductive path between the drain layer and source layer when the junction FET is ON, in specific embodiments the location of these terminals can be switched. Furthermore, although FIG. 2 includes a drift layer 204 isolating the vertical channel region 213 from drain layer 205 and having the same conductivity type but less dopant concentration than drain layer 205, devices in accordance with this disclosure do not necessarily require a drift region. Furthermore, the term "mesa" should not be constrained, as in FIG. 2, to a structure having trenches on either side as a mesa can be defined by a single trench on one side and some form of isolation structure on an alternative side (i.e., two trenches do not need to be formed to form a mesa). Throughout this disclosure references to actions conducted or structures located on the "side" of a mesa can include both the sidewall and the general area located out and away from the centerline of the mesa including within the mesa itself and the bottom of a trench that defines the mesa.

FIG. 2 provides a cross section 200 taken from a vertical JFET device which can be used to explain some of the benefits of certain approaches disclosed herein. The device includes mesa 201 in which a vertical current flows from a source contact 202 and a source layer 203 through a drift layer 204 to a drain layer 205. Source contact 202 can be connected to layers of interconnection such as metal wiring layers. Drift layer 204 can be an epitaxially grown layer, an implanted layer formed by implanting dopants into a substrate, or a layer-transferred layer transferred onto a substrate. Drain layer 205 can be the substrate on which the device is built. Current flow through the device is set by the state of vertical channel region 213 which is in contact with source layer 203 and drift layer 204. The state of the vertical channel is in turn controlled through the application of a bias voltage to two base contacts 206 and 207 and two base regions 208/209 and 210/211. The base regions and base contacts are electrically coupled and are effectively ohmically connected. The base regions are semiconductor material and the base contacts are contact or wiring material such as metal. Base regions 208/209 and 210/211/212 are marked using separate reference numerals as various portions of those regions will be separately referred to later in this disclosure. Base regions 208/209 and 210/211/212 have a conductivity type which is opposite to a conductivity type of source layer 203, drift layer 204, and drain layer 205. Drift layer 204 can have a lower dopant concentration relative to source layer 203 and drain layer 205.

In specific embodiments of the invention the channel control region or regions of a device can take on various forms. For example, the vertical channel region can be contacted on both sides with channel control regions. A first channel control region can be formed on one side of the mesa and a second channel control region can be formed on an opposite side of the mesa and extend through the mesa to contact the vertical channel region. For example, the channel control region in the device of cross section 200 includes base regions 208/209 and 210/211/212 which form p-n junctions with vertical channel region 213. In alternative embodiments, the channel region may only be contacted by a channel control region on one side or the other, but not both. The channel control region can also be defined by various combinations of base and gate regions. In general, although cross section 200 shows a three-terminal device with two base contacts which are coupled to a similar node in the interconnect layer (not shown) various alternative JFETs can utilize the approaches disclosed herein. For example, the channel control region could be a single base region instead of two. As another example, the JFET could include a gate terminal coupled to a gate electrode separately from any base region. The gate terminal could exist in combination with or in alternative to the base terminals illustrated in cross section 200. The gate terminal could also replace one of two base contacts by being used on only one side while a counterpart base contact was formed on a second side of the mesa. With reference to FIG. 2, this could include forming a gate contact in place of base region 209 while leaving base region 211/210 the same.

Figure 1:
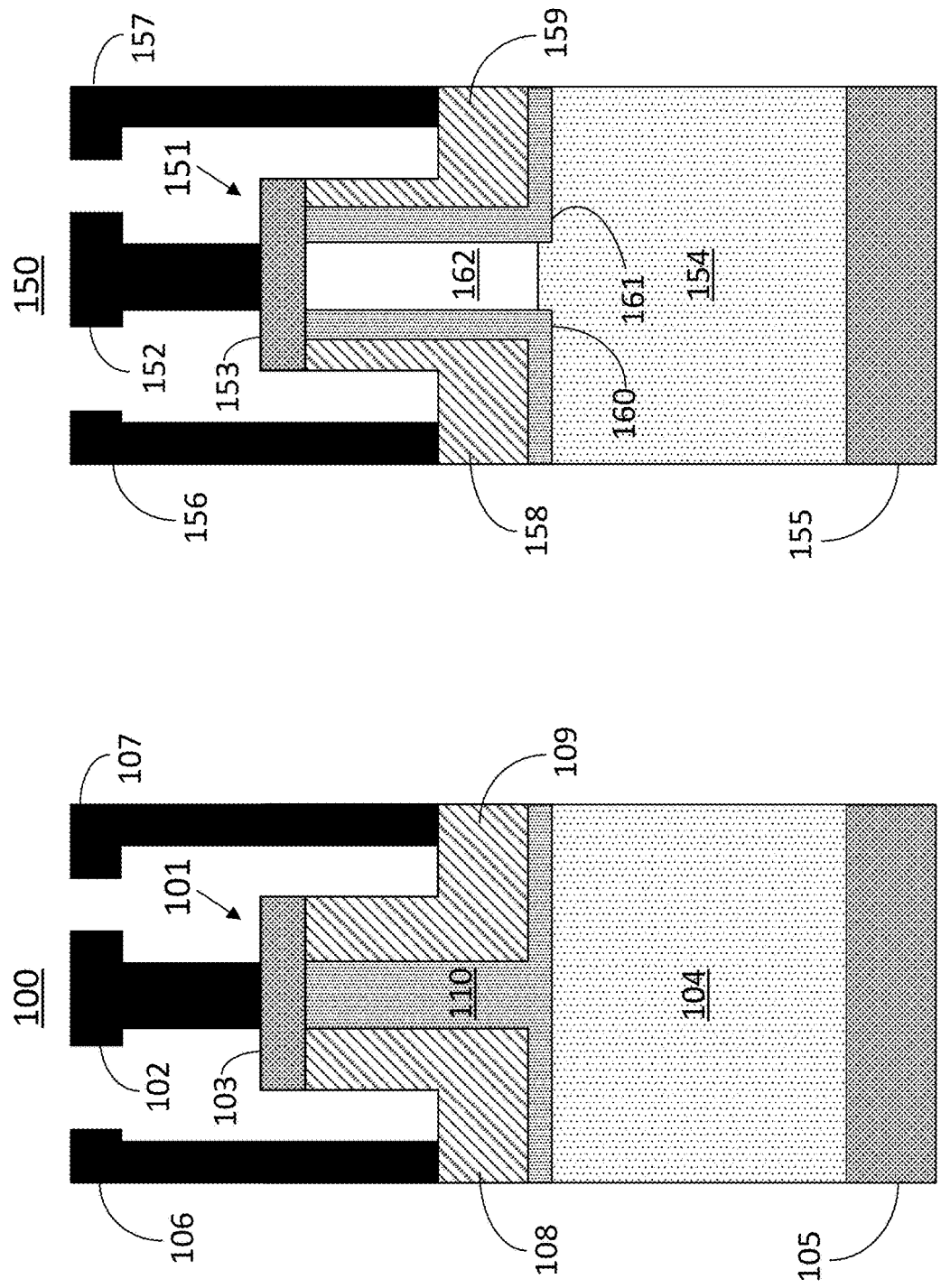
FIG. 1 illustrates two cross sections taken from different types of vertical JFET devices in accordance with the related art.

In specific embodiments of the invention, a vertical channel region, such as vertical channel region 213, is formed through the controlled introduction of dopants into a mesa, such as mesa 201, after the mesa has been formed. For example, vertical channel region 213 can be an implanted vertical channel formed by implanting dopant particles into a side of mesa 201. The implant can be an angled implant directed at the side of mesa 201. The vertical channel region can, in accordance with vertical channel region 213, be asymmetrically located in the mesa and be closer to one sidewall of the mesa than the other. In specific embodiments of the invention, the vertical channel region is closer to one side of the mesa because it is produced via an angled implant directed at that side of the mesa and the depth of the implant is controlled to keep the resulting region formed towards that side of the mesa. Devices in accordance with this characteristic of FIG. 2 can exhibit improved electrical characteristics as compared to prior art approaches. For example, an implanted vertical channel may not exhibit the dopant variability of epitaxial layers to the same extent as prior art approaches in which the vertical channel is formed by the characteristics of an epitaxially grown silicon layer. Moreover, in specific embodiments of the invention, the width of an implanted vertical channel region formed on one side of the mesa is independent of the width of the mesa which provides further benefits as described below. This decrease in variability will lead to devices having closer electrical characteristics to those expected by the designer allowing for a more controlled pinch off and maximum current performance as compared to prior art approaches such as those described with reference to FIG. 1 in which channel region 110 is formed in epitaxial silicon.

Those of ordinary skill in the art will recognize that an implanted channel region has a different structural and physical characteristic as compared to a channel region formed by epitaxially growing semiconductor material or through direct surface treatments such as physical layer deposition such that referring to an "implanted channel" refers to a region of semiconductor material having such structural and physical characteristics.

In specific embodiments of the invention, a single channel region, such as channel region 213, will be the only channel in the mesa of the device. The channel width of the junction FET comprised of that single mesa will then be equal to the channel width of that single vertical channel region, and be independent of the mesa width. Such embodiments are therefore structurally distinguishable from prior art approaches in which two separate channel regions are formed via the introduction of dopants to both sides of a single mesa. Furthermore, in these embodiments, and where the channel region is biased toward one side or the other (e.g., it is closer to one side of the mesa than the other), the device can be referred to as an asymmetric channel mesa. Such embodiments are therefore structurally distinguishable from prior art approaches in which a single central channel region is formed via the introduction of channel control dopants into both sides of a single mesa. As used in this disclosure, the term channel control dopants are dopants that alter the characteristic of a semiconductor material to provide it with an opposite polarity to the polarity of the channel.

As mentioned previously, in specific embodiments of the invention, the vertical channel region, such a vertical channel region 213 in the device of cross section 200, can be contacted on both sides by channel control regions. Devices in accordance with this characteristic of FIG. 2 can exhibit less sensitivity to manufacturing variabilities in the width of their mesas and better pinch off performance as compared to prior art approaches. For example, since vertical channel region 213 is contacted on both sides by channel control regions (e.g., it forms p-n junctions with both base region 208/209 and base region 210/211/212) the channel can be reliably depleted due to electric fields applied from multiple directions. Furthermore, since base region 210/211/212 extends through mesa 201 to form a p-n junction with the vertical channel region 213 and only one channel region is formed in the mesa as opposed to two channel regions, the effect of two dopant regions of the same type across the width of the mesa does not impact the characteristics of the channel. This is important because the effect will vary based on the width of the mesa and the width of the mesa can vary considerably in certain manufacturing applications. For example, a mask pattern used to form the trenches that define the mesas on a chip can vary considerably from what was intended by the designer as a whole, from one device to another device, and across a single device.

Figure 3:
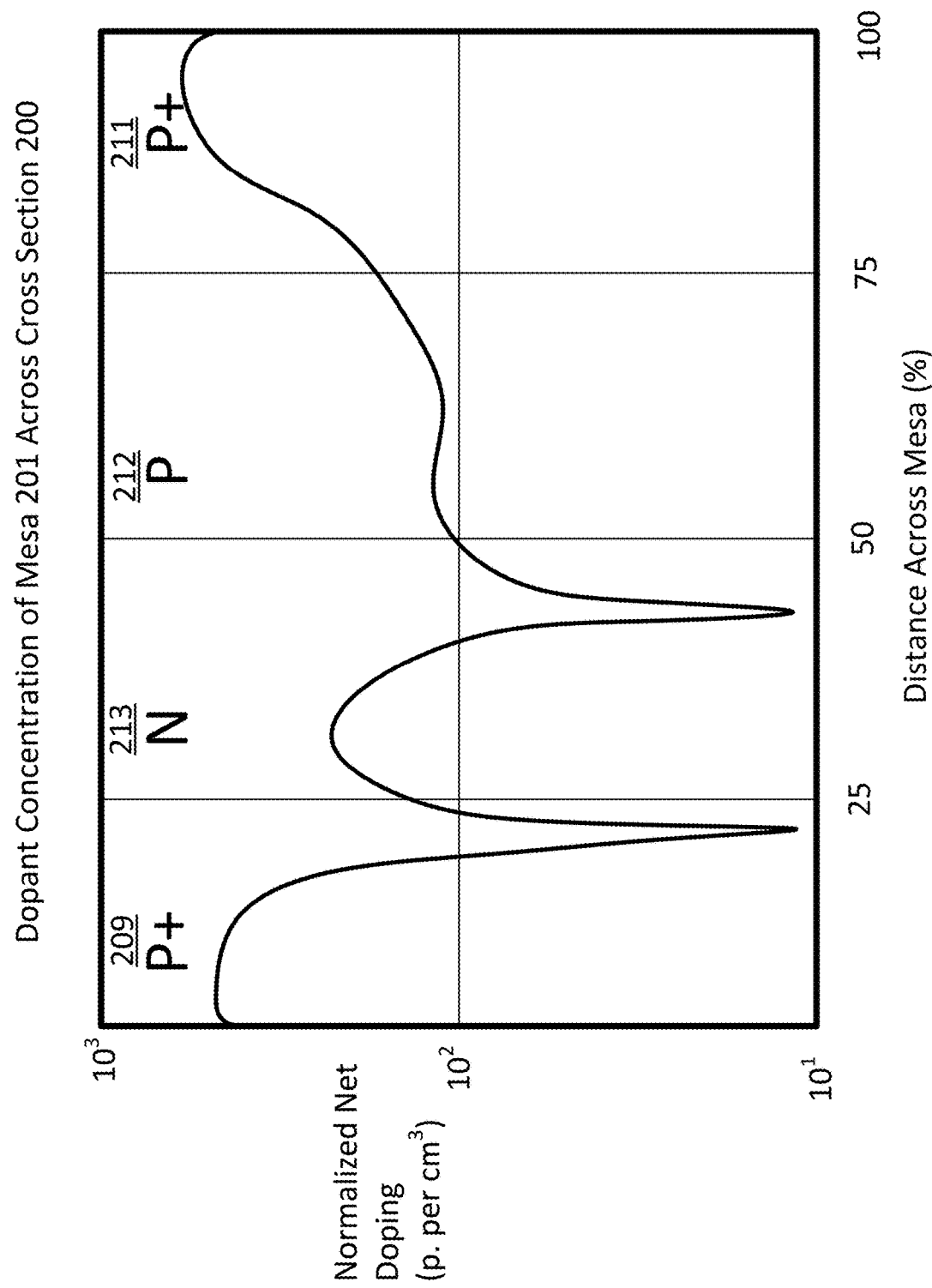
FIG. 3 illustrates a plot of the dopant concentration of a cross section of the mesa of a vertical JFET in accordance with specific embodiments of the invention disclosed herein.

FIG. 3 illustrates a plot of a potential dopant concentration across mesa 201. The specific dopant concentration is for an n-type channel device, but the same general concepts apply to a p-type channel device and cross section 200 is representative of both types of devices. The abscissa of the plot is the distance, in percent, moving from left to right in the plane of cross section 200 across the mesa with zero percent being the left sidewall of mesa 201 and one hundred percent being the right sidewall of mesa 201. The ordinate of the plot is the normalized net doping at that point in the mesa in units of parts per centimeter cubed. In the illustrated plot, the channel region 213 is n-type, first base region 209 is strong p-type, and the second base region has a low doped portion 212 and a high doped portion 211. The low doped portion 212 can be a layer of material formed in the mesa that at one point in the fabrication procedure extended across the entire illustrated cross section (e.g. an epitaxially grown layer in which the mesa was formed or an implanted layer). The channel region 213, first base region 209, and high doped portion 211, can be implanted regions formed by implanting dopants into that original layer. For example, the regions can be implanted using tilted implants that target one side or the other of the mesa. As illustrated, the dopant concentration of low doped portion 212 flattens out to a level that was defined by that original layer at a point at which the effect of the implant that formed high doped portion 211 no longer has an impact (at around 60%). As used in this disclosure with reference to devices in accordance with specific embodiments of the present invention, the term "low doped region" refers to a lower level of doping relative to an associated "high doped region" (i.e., they are high and low relative to each other) with the low doped region having less than 60% of the dopant concentration of the high doped region. As a result, the width of channel region 213 is determined predominately by the implant that forms 209, the implant that forms channel region 213, and the characteristic of the original layer, and the width of the mesa does not have a first order impact on the width of the channel. This contrasts with the dopant profile described with reference to FIG. 4.

Figure 4:
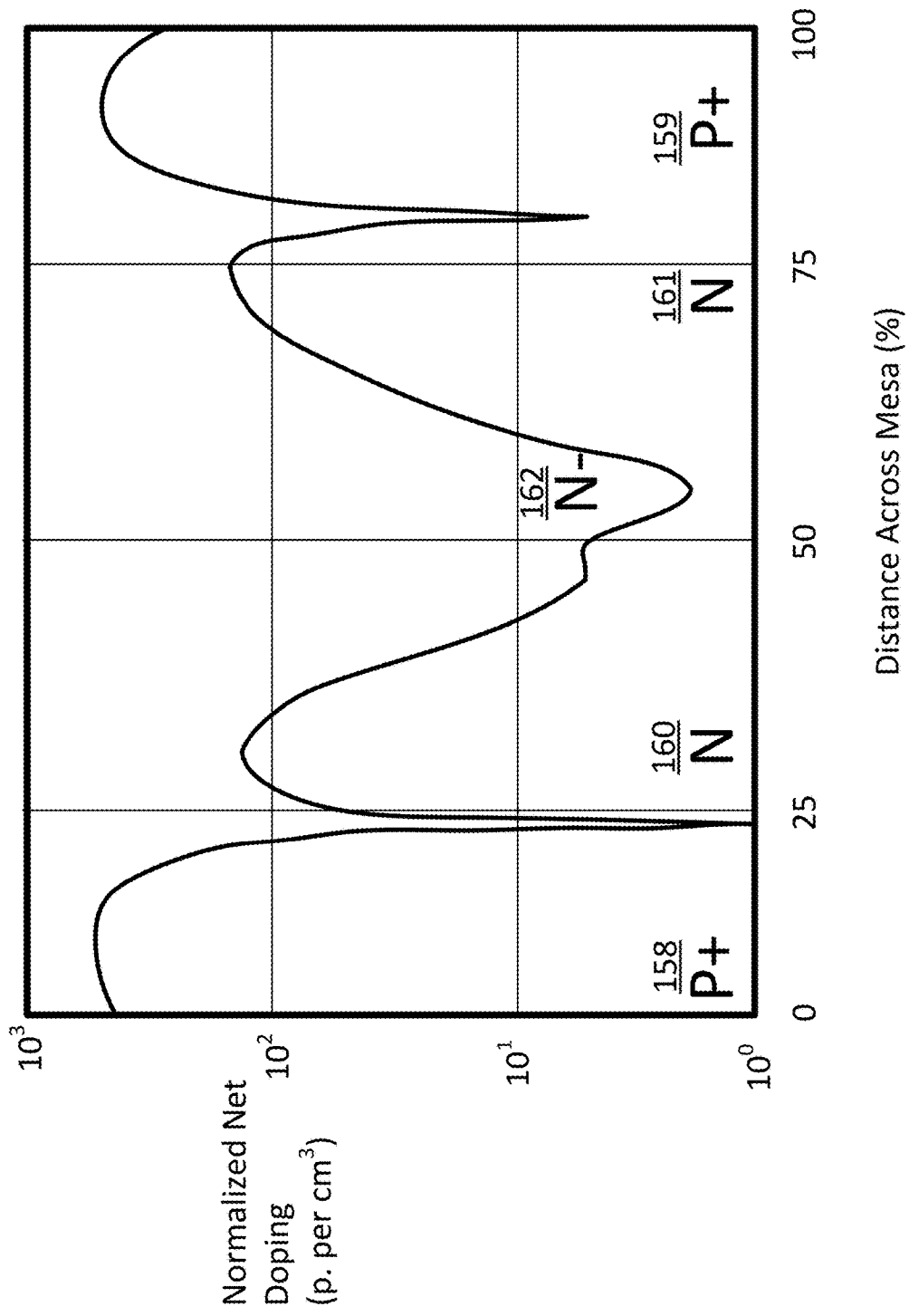
FIG. 4 illustrates a plot of the dopant concentration of a cross section of the mesa of a vertical JFET in accordance with the related art.

FIG. 4 illustrates a plot of a potential dopant concentration across mesa 151. The abscissa of the plot is the distance, in percent, moving from left to right in the plane of cross section 150 across the mesa with zero percent being the left sidewall of mesa 151 and one hundred percent being the right sidewall of mesa 151. The ordinate of the plot is the normalized net doping at that point in the mesa in units of parts per centimeter cubed. In the illustrated plot, the channel regions 160 and 161 are n-type, first base region 158 is strong p-type, and second base region 159 is also strong p-type. The center of mesa 151 is a lightly doped semiconductor layer 162 which could be an original layer of material formed in the mesa that at one point in the fabrication procedure extended across the entire illustrated cross section. The channel region 213, first base region 209, and high doped portion 211, can be implanted regions formed by implanting dopants into that original layer. For example, the regions can be implanted using tilted implants that target one side or the other of the mesa. As illustrated, the width of the channel regions 160 and 161 is somewhat ill defined as there is no sharp decrease to zero on either side as with channel 213 in FIG. 3. Furthermore, the channel regions 160 and 161 will impact each other in a manner that is dependent upon the distance between the peak of either region. This distance varies with the width of the mesa. As a result, variations in the width of mesa 151 will directly impact the electrical characteristics of the transistor and impact any designed tradeoff between the ON and OFF states of the device. As can be seen in a comparison of FIGS. 3 and 4, specific embodiments of the invention disclosed herein alleviate this issue and provide for a well-controlled and predictable channel width that is not directly susceptible to variations in the width of the mesa.

Figure 5:
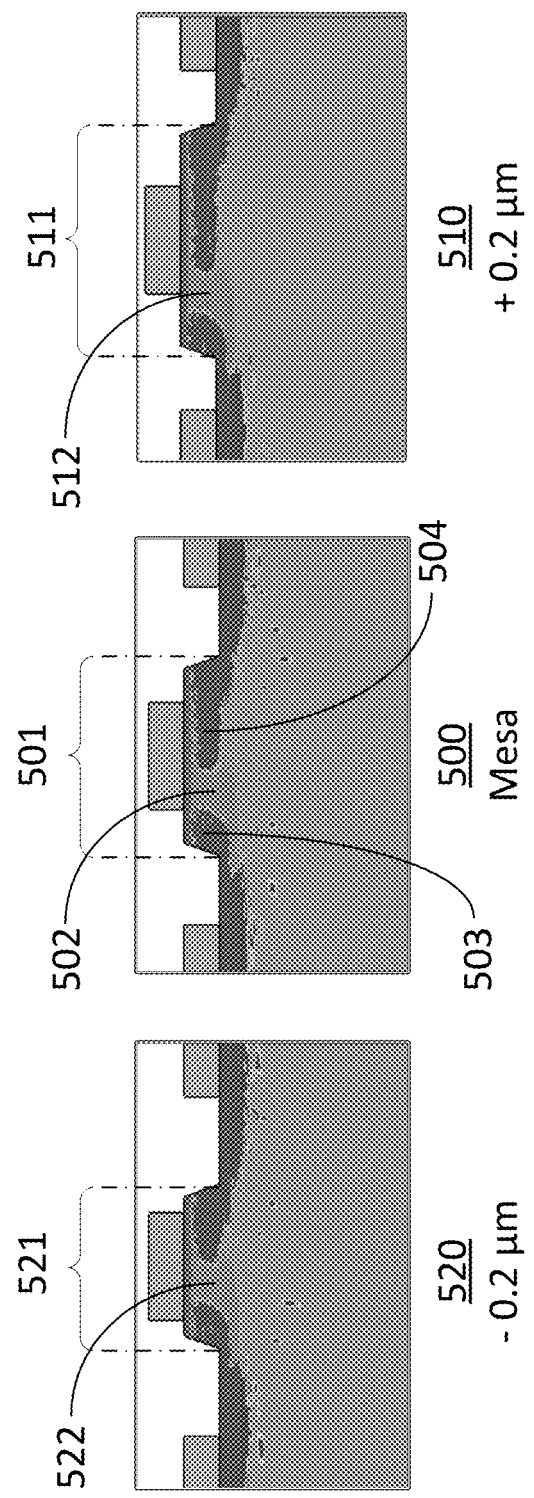
FIG. 5 illustrates three simulations of the dopant concentration in a cross section of a vertical JFET device with three different mesa widths to illustrate the benefits of specific embodiments of the invention disclosed herein.

FIG. 5 illustrates three simulations of the dopant concentration in a cross section of a vertical JFET device with three different mesa widths to illustrate the benefits of specific embodiments of the invention disclosed herein with. Cross section 500 is the baseline device and includes a mesa width 501 of one micrometer. The simulation shows two channel control regions 504 and 503 forming p-n junctions with channel region 502. The device in cross section 510 includes a mesa width 511 which is 0.2 micrometers wider than mesa width 501. The device in cross section 520 includes a mesa width 521 which is 0.2 micrometers narrower than mesa width 501. However, as can be seen, in each cross section the resulting channel width of channels 502, 512, and 522 remain approximately equal. The simulated performance of these devices is described below with reference to FIGS. 6-8.

Figure 6:
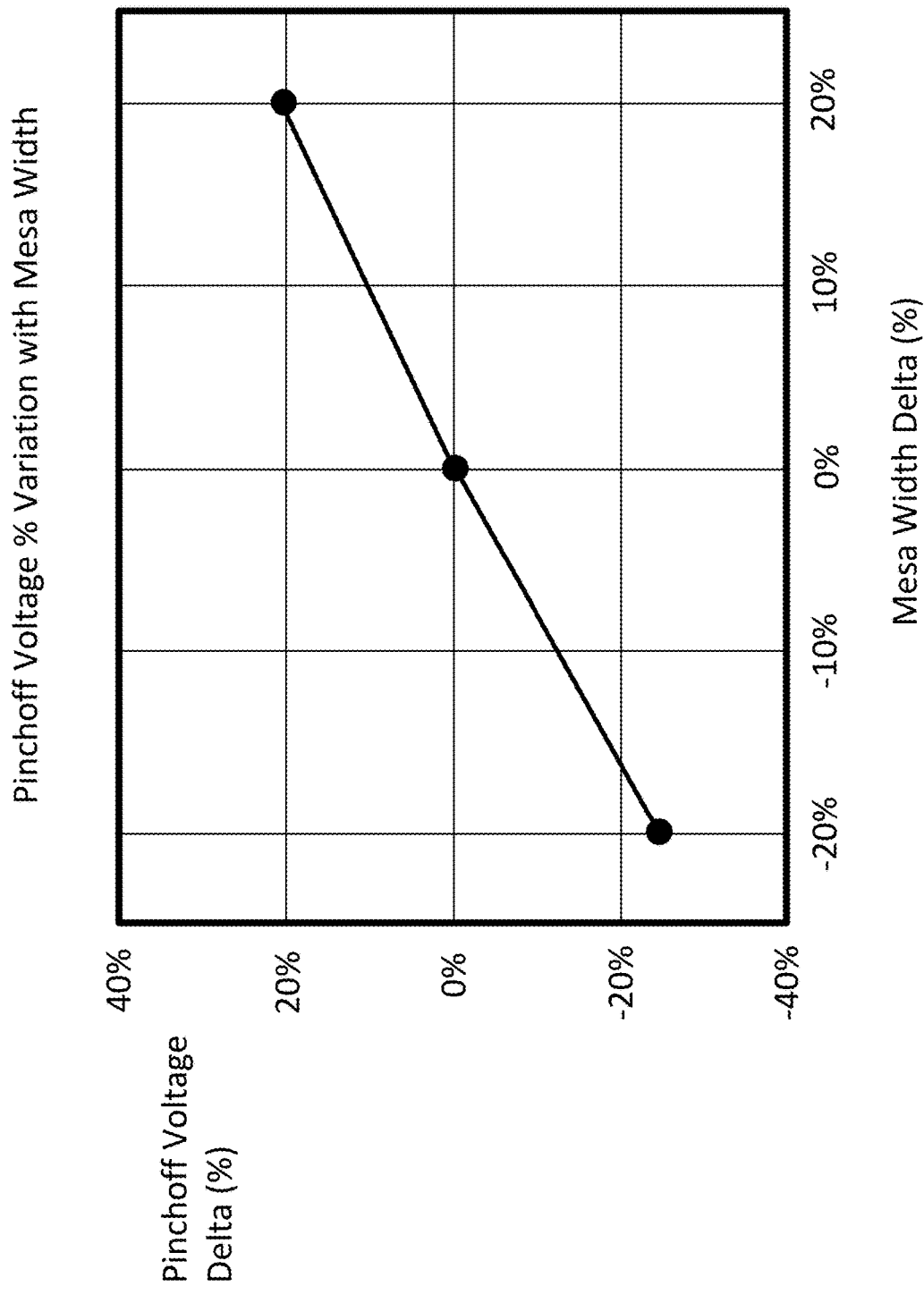
FIG. 6 illustrates a plot of the change in a pinch off voltage of the devices simulated in FIG. 5 to illustrate the benefits of specific embodiments of the invention disclosed herein.

FIG. 6 illustrates a plot of the change in a pinch off voltage of the devices simulated in FIG. 5 to illustrate the benefits of specific embodiments of the invention disclosed herein. The abscissa of the plot is the change in the width of the mesa in percent. The ordinate of the plot is the change in pinch off voltage. The three points on the plot are generated from each of the three simulations from FIG. 5. As illustrated, the pinch-off voltage does change due to the width of the low doped channel control region increasing in size. However, the variation has a linear relationship to the mesa width which indicates that the channel is indeed not directly affected by the change in mesa width. This is so because if it were otherwise, the change in pinch-off voltage would be nonlinear and unacceptable.

Figure 7:
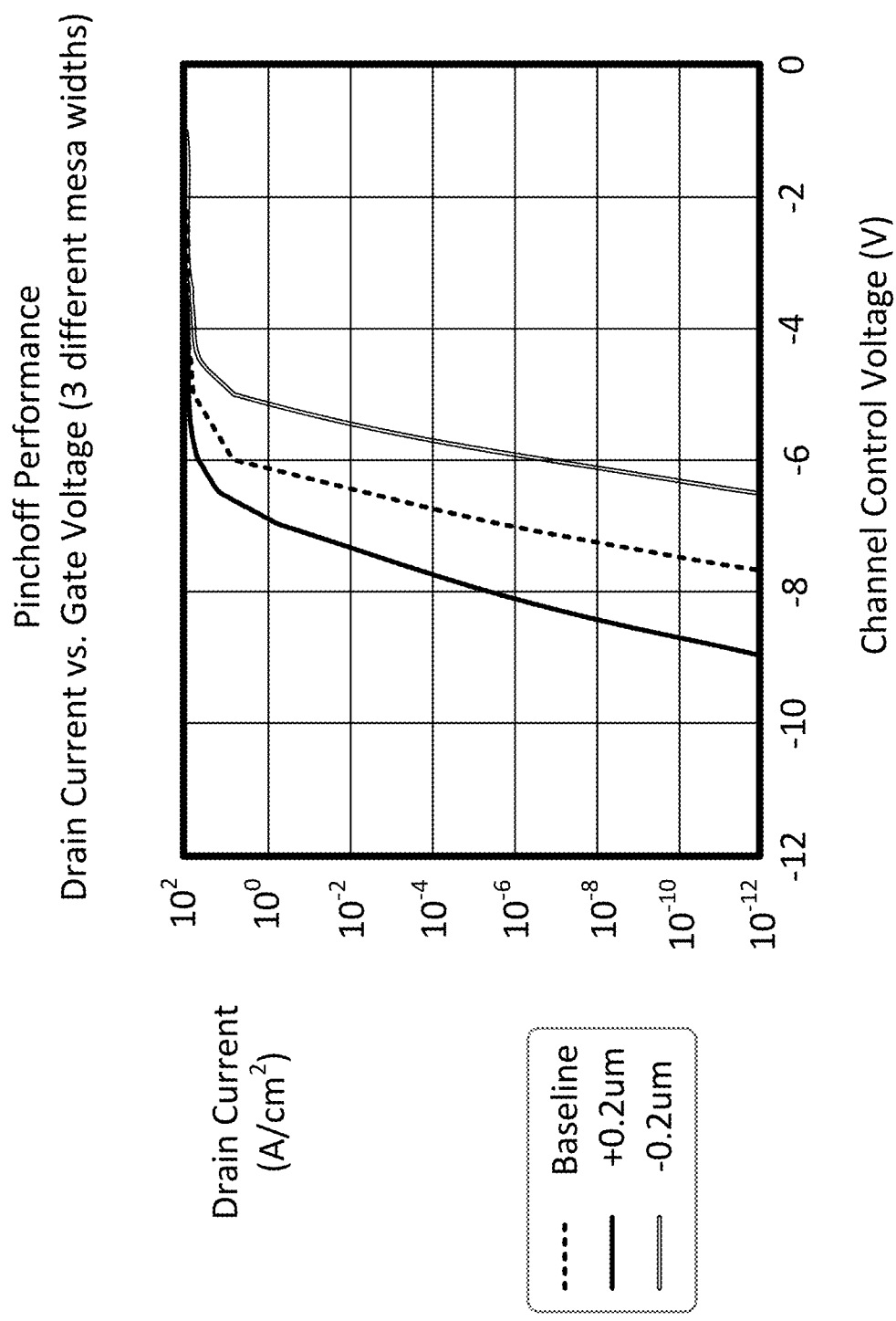
FIG. 7 illustrates a plot of the pinch off performance in terms of drain current against gate voltage for the devices simulated in FIG. 5 to illustrate the benefits of specific embodiments of the invention disclosed herein.

FIG. 7 illustrates a plot of the pinch off performance in terms of drain current against channel control voltage for the devices simulated in FIG. 5 to illustrate the benefits of specific embodiments of the invention disclosed herein. The abscissa of the plot is the channel control voltage in volts. The ordinate of the plot is the drain current per channel area unit in amperes per square centimeter. The three curves are for the baseline device, shown as a dotted line, mesa width 521, shown as a light double solid line, and mesa width 511, shown as a dark solid line. As seen, there are reasonable options for designing the on and off bias voltages to assure satisfactory performance for all three devices (e.g., an OFF voltage of −8 volts and an ON voltage of −4 volts).

Figure 8:
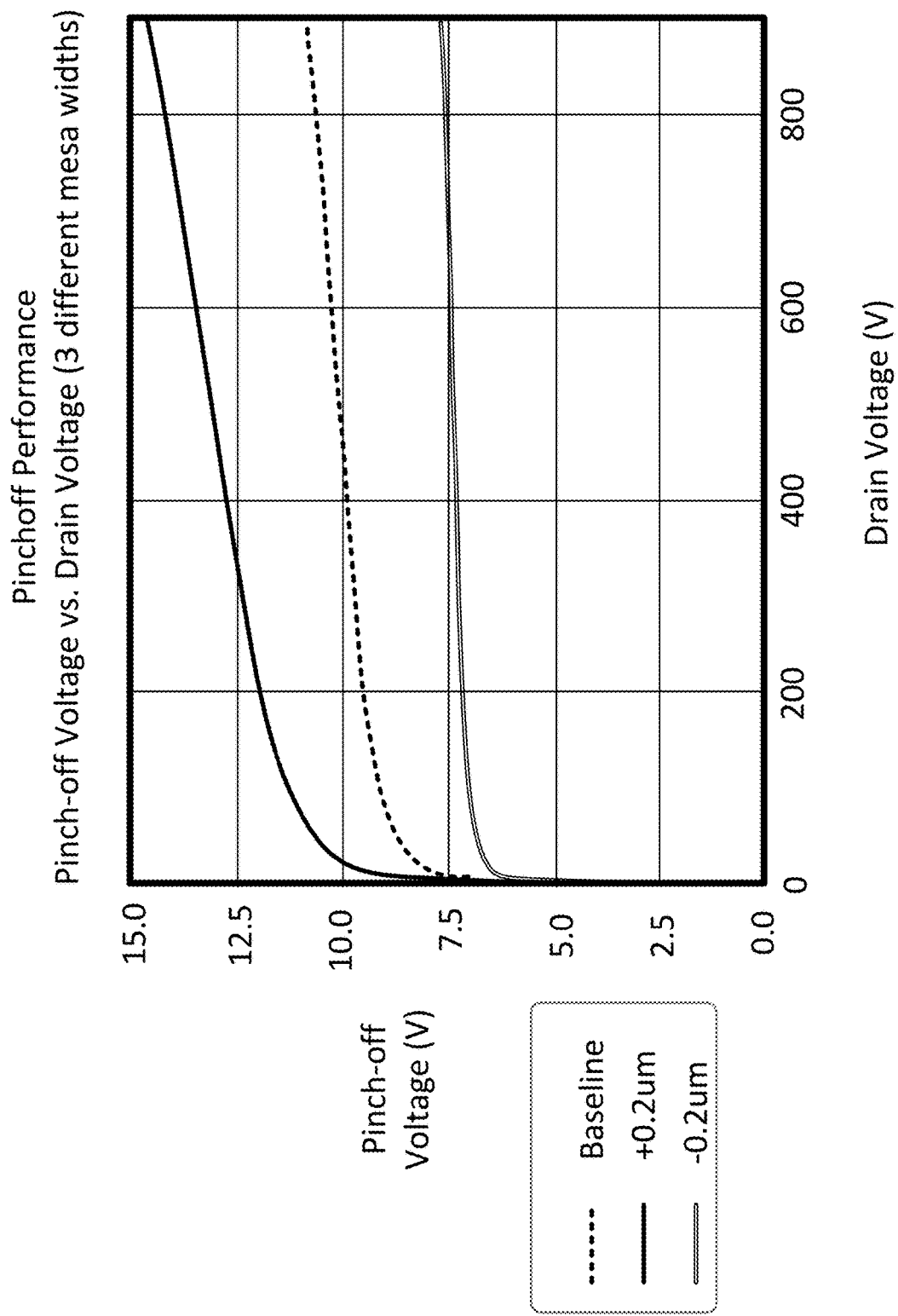
FIG. 8 illustrates a plot of the pinch off performance in terms of pinch off voltage against drain voltage for the devices simulated in FIG. 5 to illustrate the benefits of specific embodiments of the invention disclosed herein.

FIG. 8 illustrates a plot of the pinch off performance in terms of pinch off voltage against drain voltage for the devices simulated in FIG. 5 to illustrate the benefits of specific embodiments of the invention disclosed herein. The abscissa of the plot is the drain voltage in volts. The ordinate of the plot is the pinch-off voltage in volts. The three curves are for the baseline device, shown as a dotted line, mesa width 521, shown as a light double solid line, and mesa width 511, shown as a dark solid line. The pinch-off voltage increases with an increase in drain voltage. The device being harder to keep turned off when the voltage across the device increases. Again, as with FIG. 7, although variation is evident from one simulation to the other, those of ordinary skill will recognize that a reasonable pinch-off voltage can be selected to allow the device to function, even in light of other trade off considerations, in spite of the variation in mesa width across the three simulations.

Devices in accordance with specific embodiments of the invention can be fabricated using various methods. The methods can include forming a mesa on a substrate where the mesa includes a first layer with a first conductivity type located over a second layer with a second conductivity type, and, after forming the mesa, forming a vertical channel region for the JFET. The vertical channel region can have the first conductivity type and be formed on a first side of the mesa in the second layer. In specific embodiments of the invention, the formation of the vertical channel region can be conducted by implanting dopants into the mesa to form an implanted vertical channel region. In a finalized device, the first layer can be a source layer of the device, the second layer can include at least a portion of a vertical channel and at least a portion of the channel control region, and the drain of the device can be a substrate on which the mesa is located. The vertical channel can be in contact with the source region and a portion of the second layer which retains the second conductivity type. The portion which retains the second conductivity type can be the aforementioned portion of the channel control region. In specific embodiments of the invention, the portion which retains the second conductivity type will be a channel control region that extends through the mesa to contact the vertical channel. In specific embodiments of the invention, that portion of the channel control region can be a portion of a base region.

Figure 9:
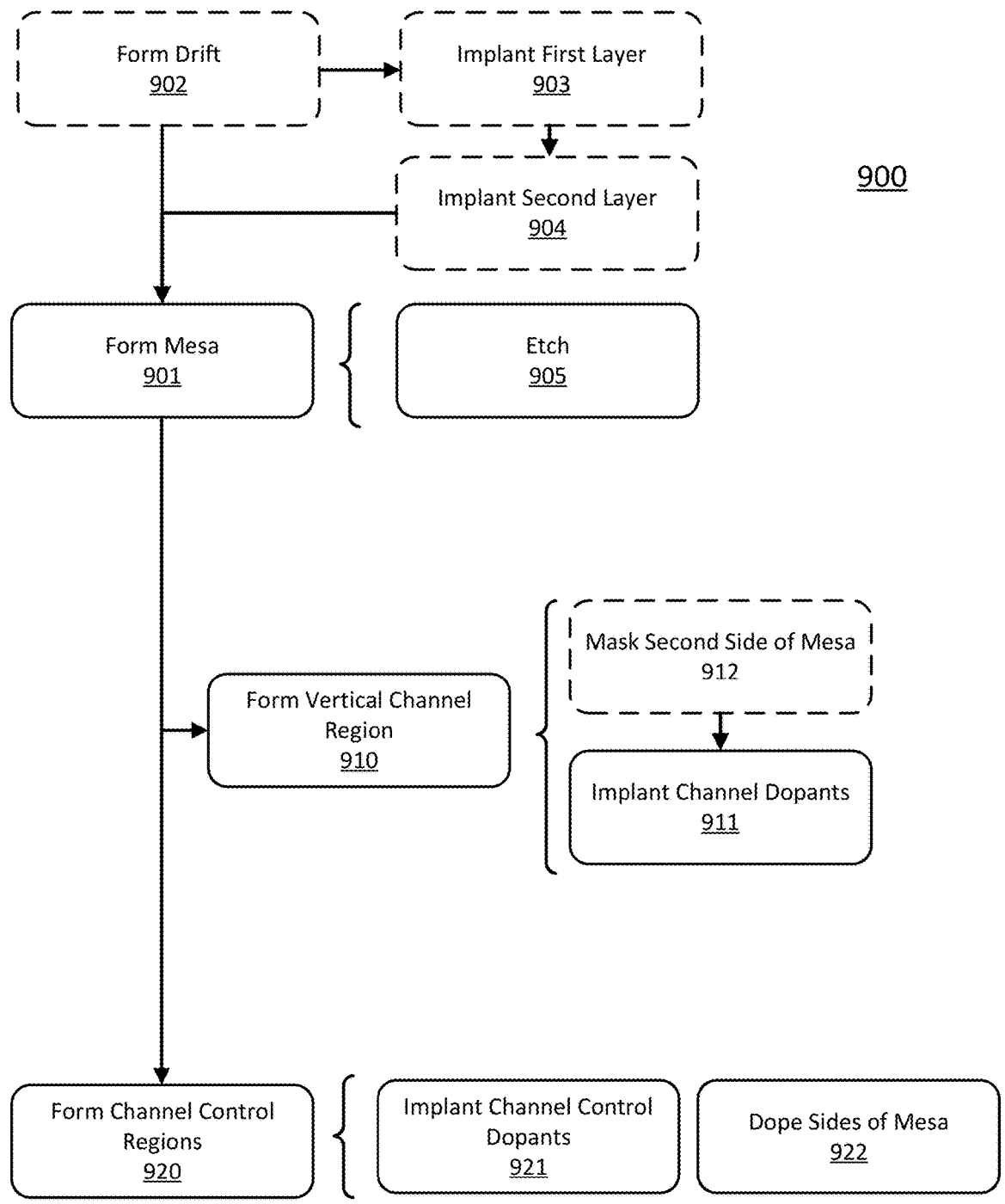
FIG. 9 illustrates a flow chart for a set of methods for fabricating a device in accordance with specific embodiments of the invention disclosed herein.

FIG. 9 illustrates a flow chart 900 for a set of methods for fabricating a device in accordance with specific embodiments of the invention disclosed herein. In flow chart 900, steps set off by brackets indicate optional sub-steps while steps with dotted line borders are independent optional steps. The flow chart includes three main steps of forming a mesa 901, forming a vertical channel region 910, and forming a channel control region 920. The step of forming a mesa 901 splits to both other main steps because steps 910 and 920 can be conducted in various orders depending upon a given implementation. For example, sidewalls of a mesa can be treated to form a first set of channel control regions as part of step 920, then the vertical channel can be formed by an implant step through one of those channel control regions to complete step 910, and then another treatment targeting the sides of the mesa can further develop the channel control regions to complete step 920. However, that additional treatment may be optional such that the steps simply went from step 920 to 910. Alternatively, a channel could be formed in a mesa first using an implant process followed by a surface treatment of the mesa to form the channel control region such that the steps simply went from step 910 to 920. As such, steps 910 and 920 can be interrelated in various ways.

Figure 10:
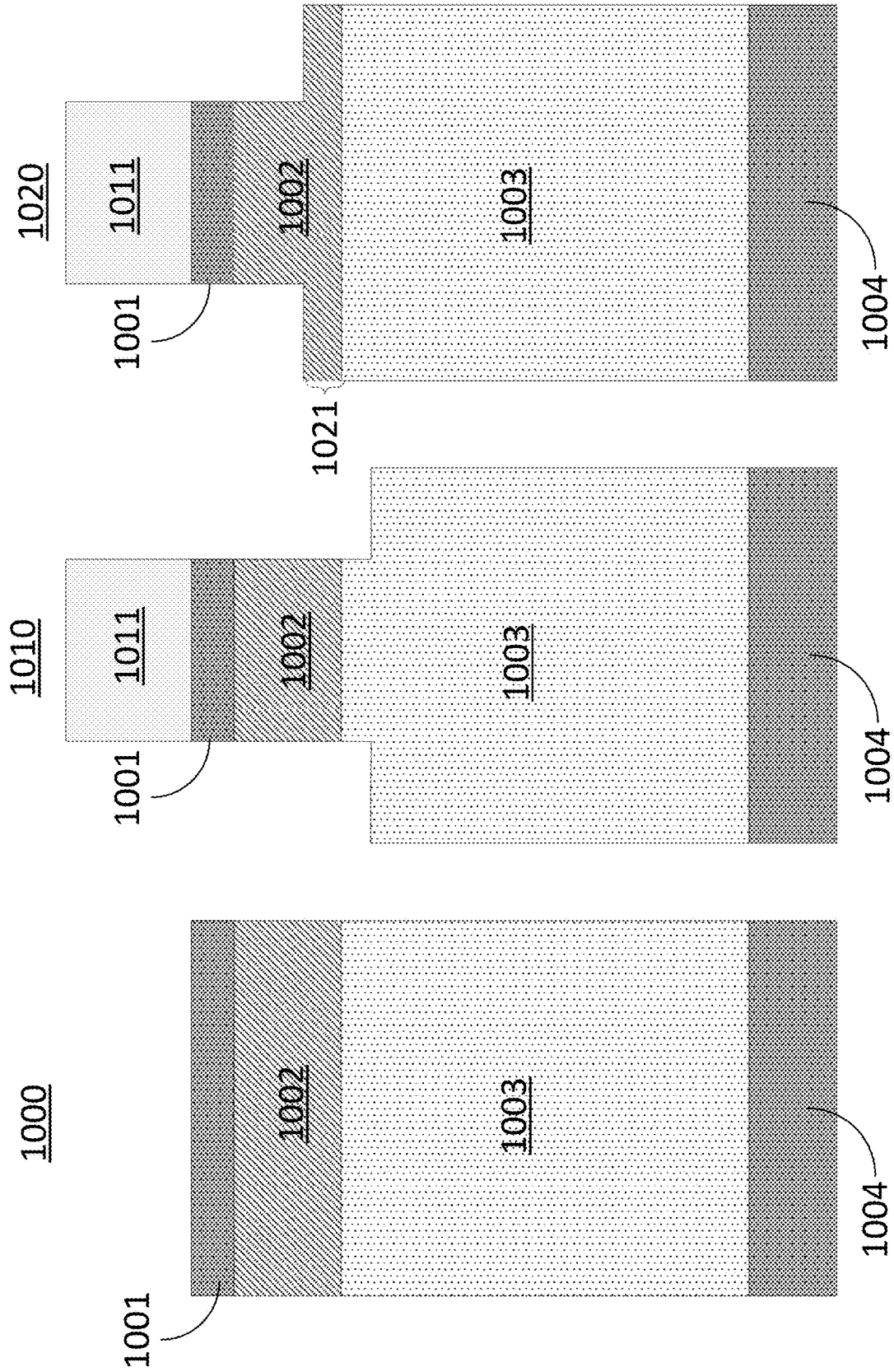
FIG. 10 illustrates various fabrication cross sections to illustrate the formation of a mesa in accordance with specific embodiments of the invention disclosed herein.

Flow chart 900 includes a step 901 of forming a mesa which is associated with various optional steps and sub-steps. A specific implementation of some of these steps can be described with reference to FIG. 10 which illustrates various fabrication cross sections. The cross sections include cross section 1000 which can be etched to form either cross section 1010 or cross section 1020. When the same region shows up in more than one cross section the same reference numeral is used to refer to the region in both cross sections.

Fabrication cross section 1000 includes a first layer 1001, a second layer 1002, a third layer 1003, and a fourth layer 1004. In specific embodiments of the invention, the first layer 1001 will ultimately be a source region of a finalized transistor and will have a first conductivity type, second layer 1002 will ultimately contain the vertical channel and channel control regions and has a second conductivity type, third layer 1003 will be the drift layer and have the first conductivity type, and fourth layer 1004 is the substrate on which the device is formed and has the first conductivity type. Cross section 1000 can be fabricated in various ways.

Fourth layer 1004 can be bulk semiconductor material and can be part of an original semiconductor wafer on which transistors will be formed. For example, the substrate can be a silicon carbide substrate with a doping range on the order of 1e18 to 1e21 particles per centimeter cubed. The same doping range would be applicable if the substrate were to be n-type or p-type.

Third layer 1003 can be formed via the formation of a drift layer as in step 902 of flow chart 900. The drift region can be formed by epitaxially growing the layer on a substrate (e.g., fourth layer 1004). In alternative embodiments, the drift region can be formed using a dopant implant process by implanting dopants into a substrate. In specific embodiments of the invention, the drift region can be silicon carbide with a dopant concentration on the order of 1e15 to 3e16 particles per centimeter cubed as controlled while the layer is being epitaxially grown or otherwise formed. The same doping range would be applicable if the drift region were to be n-type or p-type. In specific embodiments of the invention, the drift region can have a width in the range of 3 micrometers to 120 micrometers depending upon the voltage rating required for the transistor being fabricated.

First layer 1001 and second layer 1002 can be formed in various ways. For example, as shown in FIG. 9, the first layer 1001 can be formed by a step 903 of implanting the first layer with dopants of a first conductivity type, while the second layer 1002 can be formed by a step 904 of implanting a second layer with dopants of a second conductivity type. The first conductivity type will be the same conductivity type as the substrate. The first and second conductivity types can be opposite. The second layer can have a dopant concentration on the order of 1e16 to 2e18 particles per centimeter cubed. The first layer can have a dopant concentration on the order of 1e18 to 1e21 particles per centimeter cubed. In embodiments in which a drift region was formed (i.e., step 902 was conducted), the implanting steps can involve implanting dopants into the drift region. In embodiments in which the first and second layers are implanted, a mask could be used to block implantation at the edge of a die as it is undesirable to have channel control and source regions on the edges of the die. In alternative embodiments, the first layer and second layers can be epitaxially grown with the second layer grown on the drift region or directly on the substrate if the drift region is not present. In these embodiments, an etch can be used to remove the channel control and source regions from the edge of the die. An etch can also be used if the layers are formed using implants without an edge mask.

Flow chart 900 includes a step of etching 905 as a potential sub-step for the formation of a mesa. Step 905 can be conducted by etching into a first layer and a second layer. The first layer can have a first conductivity type. The first layer can be a source layer. The second layer can have a second conductivity type opposite the first. The second layer can be a layer which will ultimately include a vertical channel and channel control region in a finalized device. The etch can be an anisotropic etch conducted with a patterned mask used to define the mesa by exposing the sides of the mesa to the etchant. Cross section 1010 provides an example of this step as mask 1011 covers the mesa and the sides of the mesa are defined when the negative of mask 1011 is removed by the etch. The patterned mask can be made of photoresist. The mask can be a hard mask. In embodiments in which the semiconductor material is silicon carbide, the hard mask can be an oxide, nitride, or metallic mask. A hard mask can be used to avoid an etch of a photoresist mask and avoid the need for overly thick layers of photoresist and the resultant decrease in pattern resolution. In specific embodiments of the invention, the hard mask material can be deposited first, and then etched using a photoresist mask. In these embodiments the photoresist can be retained or removed prior to the etch of the semiconductor material.

In specific implementations of step 901, the depth of the mesa can be set in various ways. The desired characteristics of the vertical channel can impact the desired depth. As described above, a vertical channel region can be formed on a side of the mesa and can contact the source region and the drift or drain region in a finalized device. As such, it can be desirous for the depth of the mesa to be at least as deep as the base region as in cross section 1010. As can be seen, if the vertical channel is formed on the side of the mesa it will extend from first layer 1001, which can be the source layer, down to third layer 1003, which can be the drift layer. However, in specific embodiments of the invention, the vertical channel is formed through an implant that will penetrate into the mesa below the surface on which the mesa is formed. Accordingly, in embodiments in which the mesa is formed by etching a trench, the trench depth can be greater than or equal to the depth of the second layer less the implant depth of the channel below the trench and the device. This concept is illustrated by cross section 1020 in which the etch terminates in the second layer 1002. In these embodiments, the device could still be fabricated so long as an implant used to form the channel region from the side of the mesa would be implanted to at least a depth 1021.

In specific embodiments in which the mesa is formed using an etching step, the etch can be conducted in various ways. The etch can be a timed etch designed to etch all the way through the first and second layers. The time can be selected to partially over-etch the surface on which the second layer is formed to assure that the second layer is completely etched away. The etchant can be a selective etch designed to terminate on the surface on which the second layer is formed. The etch can involve various chemistries and steps to etch the two layers separately. In specific embodiments of the invention, the mesa can have a height on the order of 0.5-2 micrometers and a width of 0.5-2 micrometers. In specific manufacturing environments, the variation of those values caused by variances in the mask pattern and other manufacturing tolerances can result in a variation of plus or minus 0.2 micrometers in width.

Flow chart 900 continues with steps 910 of forming a vertical channel region and 920 of forming channel control regions. The steps can be conducted in various orders. In specific embodiments, step 920 can involve two separate steps (step 921 of implanting channel control dopants into the sides of the mesa and step 922 of doping alongside the mesa) which are conducted on either side of the execution of step 910. Various implementations of these steps can be described with reference to the cross sections in FIGS. 11 and 12.

Step 910 of forming a vertical channel can be conducted using a step 911 of implanting channel region dopants into a first side of a mesa. The implanting can be conducted using a titled implant. Any mask which may have been used to etch trenches to form the mesa can additionally be used during this implanting step. The term "channel region dopants" as used herein are dopants that set the polarity of the receiving semiconductor material to be the same type as the source and drain. A tilted implant can be conducted by tilting the substrate on which a device is located or tilting the implanter relative to a surface of the substrate. The step can be conducted so that a large number of mesas on the same die are aligned to receive the implant at the same time. The formation of the vertical channel can also include a step 912 of masking a second side of the mesa. For example, a second side of the mesa can be masked during a tilted implant. Masking the second side of the mesa can be beneficial because all the illustrated cross sections may be single cells in a multi-mesa device that extends in a repeating pattern in either direction. As some implanted dopants can backscatter and be reflected from the side at which they are directed, they may end up being implanted on the opposite side of an adjacent mesa. The mask on the "second side" can be placed to avoid this occurrence. This same mask can be used to block implant of the channel at the edges of the die.

Step 920 of forming channel control regions can also be conducted using an implant process. Step 920 can include a step 921 of implanting channel control region dopants into one or more sides of the mesa. The term "channel control region dopants" as used herein are dopants that set the polarity of the receiving semiconductor material to be the opposite of the channel region. The step can include implanting channel control region dopants into a first side of a mesa and a second side of the mesa to form a first portion of a first base region on the first side of the mesa and a high doped portion of a second base region on the second side of the mesa. Step 921 can be conducted using a tilted implant. In specific embodiments of the invention, the implant of step 921 will be conducted on both sides of the mesa, and the step can involve two or more tilted implants to target both sides of the mesa.

In specific embodiments of the invention, the implants used in steps 911 and 921 can take on various characteristics. In either step, the implant can be a tilted implant, the implant tilt can be between zero and sixty degrees, and the implant energy can be between 50 kilo-electron-volts and 500 kilo-electron-volts. The channel implant can be conducted to produce a channel doping with a concentration of 5e16 to 1e18 particles per centimeter cubed. The horizontal thickness of the channel can be between 0.05 micrometers and 0.75 micrometers. The vertical length of the channel can be between 0.3 micrometers and 2 micrometers. The channel control region implant can be conducted to produce one or more channel control regions on a sidewall of the mesa with a dopant concentration from 1e17 to 1e19 particles per centimeter cubed. Both implants can be conducted into a layer of the mesa having a dopant concentration of 1e15 to 3e16 particles per centimeter cubed with the same polarity as the channel control region implant.

Figure 11:
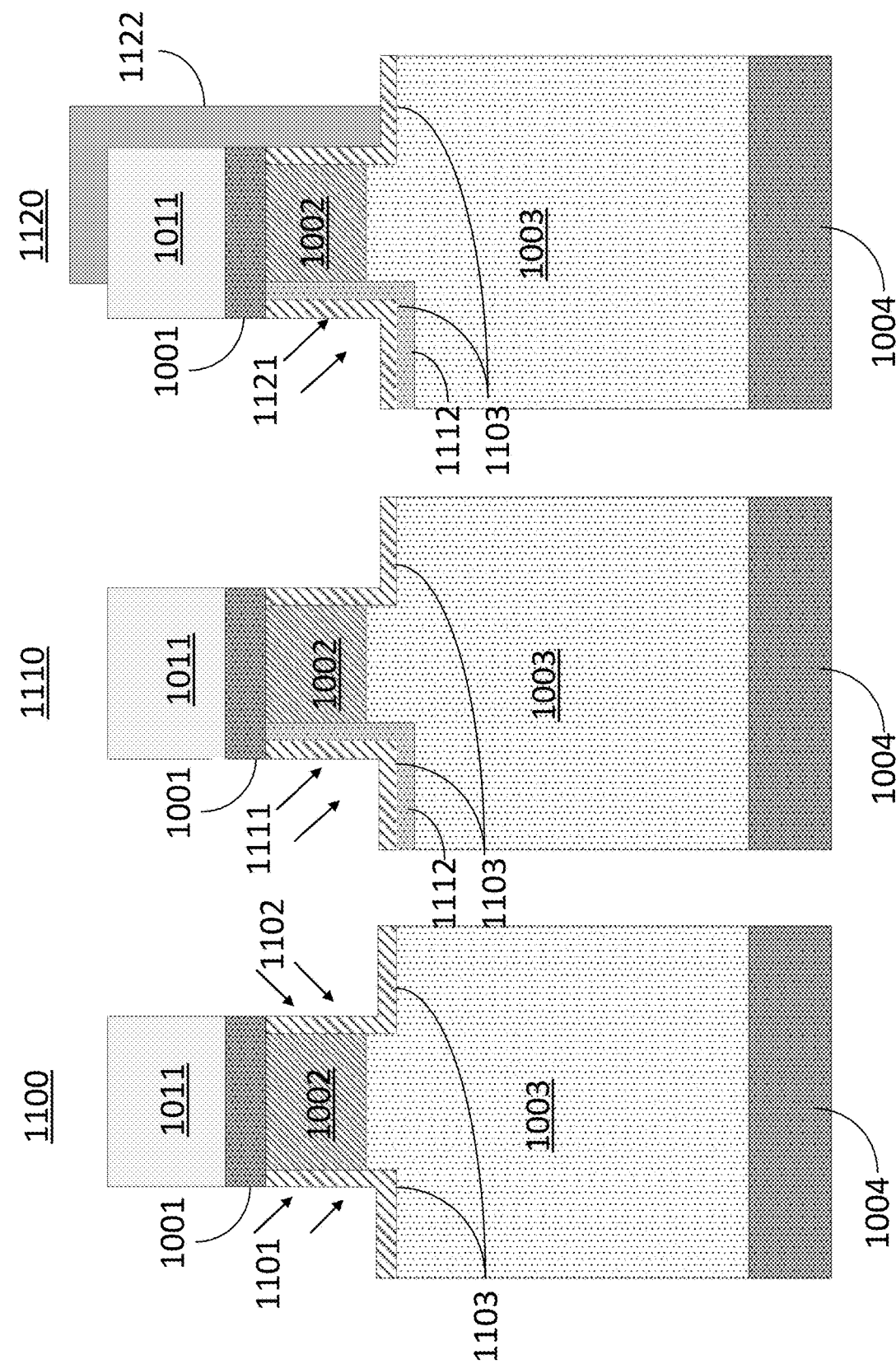
FIG. 11 illustrates various fabrication cross sections to illustrate the formation of a vertical channel in accordance with specific embodiments of the invention disclosed herein.

FIG. 11 illustrates various fabrication cross sections to illustrate the formation of a vertical channel and portions of a channel control region in accordance with specific embodiments of the invention disclosed herein. Fabrication cross section 1100 illustrates the impact of two tilted implants 1101 and 1102 that can be conducted in accordance with step 921. The resulting implants produce two regions of high dopant concentration 1103 on either sidewall of the mesa and at the bottom of the trench on either side of the mesa. Fabrication cross section 1110 illustrates the impact of a single tilted implant 1111 that can be conducted in accordance with step 911. The resulting implant produces a vertical channel region 1112 both in the side of the mesa and at the bottom of the trench on the side of the mesa. In the illustrated embodiments, the channel implant 1111 is conducted through the channel control region 1103, but the implants can be conducted in either order in different embodiments of the invention. Fabrication cross section 1120 also illustrates the impact of a single tilted implant 1121 that can be conducted in accordance with step 911, but with the addition of a mask 1122 added in accordance with step 912. The mask can be a photoresist mask or a hard mask. As described above, mask 1121 is meant to shield the mesa of cross section 1120 from backscatter caused by implant 1122 striking the sidewall of a mesa to the left of the mesa shown in cross section 1120.

Figure 12:
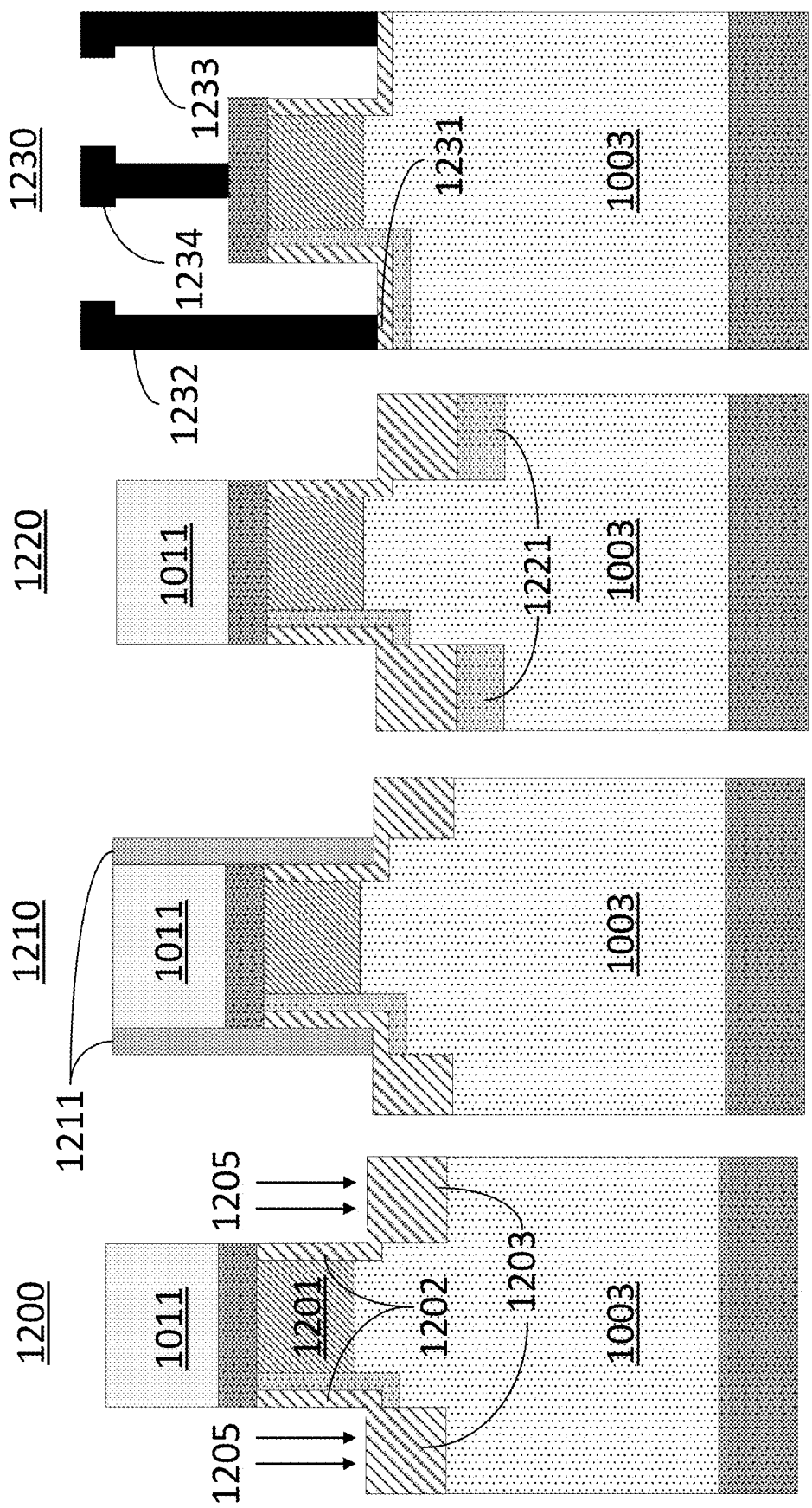
FIG. 12 illustrates various fabrication cross sections to illustrate the formation of channel control regions in accordance with specific embodiments of the invention disclosed herein.

FIG. 12 illustrates various fabrication cross sections to illustrate the formation of channel control regions in accordance with specific embodiments of the invention disclosed herein. In particular, the cross sections of FIG. 12 show various implementations of the execution of step 922 in which the sides of the mesa are doped to form channel control regions. These channel control regions can be in contact with channel control regions formed during an execution of step 921, if such a step was executed. In such embodiments, the channel control regions could include portions formed both on the sidewall of the mesa and besides the mesa. In specific embodiments, the channel control regions could include a low doped portion that is part of the second layer of the mesa before the vertical channel is formed, and a high doped portion on the side of the mesa. The high doped portion on the side of the mesa could be a portion formed on the sidewall of the mesa and/or a portion formed beside the mesa. Cross section 1200 shows an example of such an embodiment in which region 1201 is a low doped portion that is part of the second layer of the mesa before the vertical channel is formed, regions 1202 are high doped portion formed on the sidewall of the mesa, and regions 1203 are high doped portions formed beside the mesa. Regions 1203 can be formed after forming the channel of the device and can be formed using various processes.

In specific embodiments of the invention, the channel control regions can be formed on the sides of the mesa using an implant process. The region can be formed by a shallow high energy implant. The surface dopant concentration can be between 1e18 and 1e21 particles per centimeter cubed. The implant can be a chained implant with a junction depth of 0.2 to 2 micrometers to improve blocking voltage and reduce drain-induced barrier lowering. In the case of a p-type device, the dopant can be aluminum or boron. The implant can be used to allow for ohmic contact with the channel control region. With reference to fabrication cross section 1200, the regions 1203 can be formed by a shallow high energy implant 1205 to allow for the formation of contacts to bias the channel control. Mask 1011 can be used to pattern this implant.

In specific embodiments of the invention, the channel control regions formed on the sides of the mesa can be formed through a process that uses a sidewall spacer. As shown in fabrication cross section 1210, a sidewall spacer 1211 has been added to prevent the heavy dose implant from getting into the sidewall and modifying the characteristics of the sidewall implant or the vertical channel. The sidewall spacer can be self-aligned to the mask 1011 through the use of conformal deposition of a material such as oxide followed by a blanket etch.

In specific embodiments of the invention, the channel control regions formed on the sides of the mesa can be formed above a spreading current resistance region with opposite polarity formed underneath the channel control region. The spreading current resistance region itself can be formed by an implant of dopants with an opposite polarity to that of the channel control region. The spreading current resistance region can reduce spreading resistance for current coming out of the channel region. As shown in fabrication cross section 1220 the spreading current resistance regions 1221 can be formed on both sides of the mesa.

In specific embodiments of the invention, step 922 is not conducted, and contact to the channel control region is provided by a channel control region formed on the sidewall of the mesa. For example, with reference to cross section 1230, if the concentration of region 1231 is high enough, as formed through the execution of step 921, then there does not need to be an additional step to form a region such as 1203. As illustrated, contact can then be made directly to the channel control region formed during the formation of the channel control region on the sidewall of the mesa.

The methods of flow chart 900 can conclude with a step of conducting a back end of line processing to finalize the JFET. The channel width of the finalized JFET could be equal to the channel width of the vertical channel. The back end of line processing could include forming contacts to the device, isolating the device, and otherwise finalizing the device and the die on which the device is located for singulation and packaging. In specific embodiments, all implanted regions can be activated by annealing at a temperature between 1400 degrees Celsius and 1800 degrees Celsius prior to the formation of contacts or depositing any passivation films on the device. Contacts can then be formed using metals such as nickel, titanium, or aluminum. The final device could include multiple cells of the illustrated cross section with shared channel control contacts. The channel width of this finalized JFET could be equal to the sum of the channel widths of the vertical channels of each cell. For example, contact 1232 could be shared with a copy of contact 1233 on the left side of cross section 1230 and vice versa. Wiring layers above the multiple mesas of the multiple cells could also connect the source contacts of the devices such as source contact 1234 so that the source contacts were shared to create a single unified device. The drain contacts of the multiple cells would be the common substrate of the die.

In specific embodiments of the invention, the back end of line processing could involve the creation of a gate structure. The gate could be coupled to a contact. The contact could serve as a fourth terminal of the device. The gate structure could include a gate electrode and a gate insulator. Alternatively, the gate structure formed during the back end of line process could be configured to accommodate a gate electrode in the form of a first layer of metal wiring formed after the back end of line process mentioned above. The gate electrode could be doped polysilicon. In specific embodiments of the invention, the gate structure could be a vertical gate structure. In specific embodiments of the invention, the gate structure could include a vertical polysilicon gate electrode formed on a side of the mesa of the device and a gate insulator formed on the first side of the mesa. The gate insulator could isolate the vertical polysilicon gate electrode from the vertical channel.

The vertical gate structure mentioned above could be formed in various ways. The gate electrode could be formed using physical vapor deposition. For example, the gate electrode could be a polysilicon gate formed by physical vapor deposition. The chemical composition could be doped polysilicon, but alternatively it could be any metallic element. If polysilicon is used, the gate could be doped either n-type or p-type using in-situ doping during deposition, diffusion from a spin-on dopant, or using implantation. If using polysilicon, the gate electrode could be contacted through a titanium or nickel silicide which forms an ohmic contact to the polysilicon. In specific embodiments, the thickness of the polysilicon gate could be between 0.2 and 1 micrometer.

Figure 13:
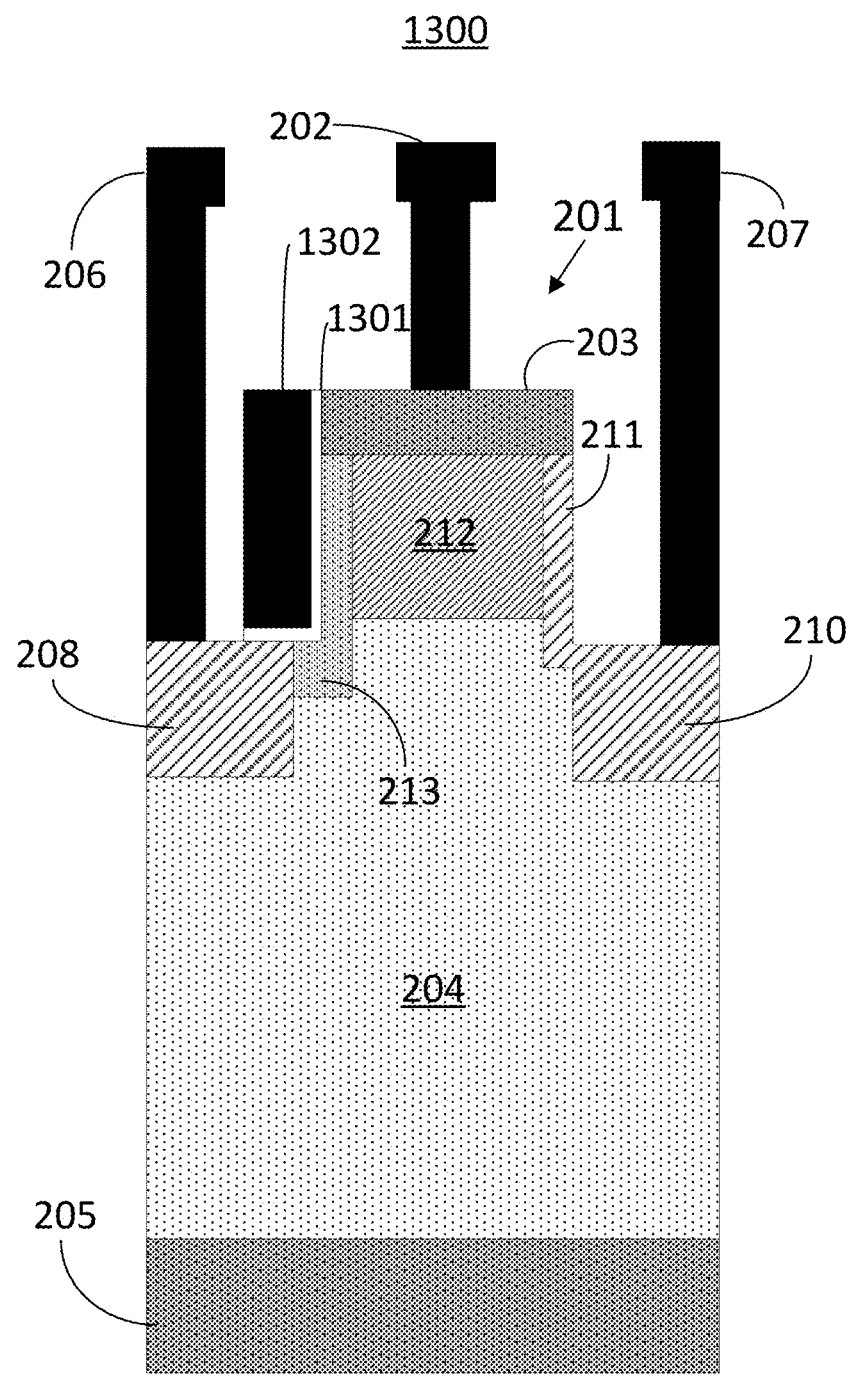
FIG. 13 illustrates a cross section taken from a four-terminal vertical JFET device in accordance with specific embodiments of the invention disclosed herein.

FIG. 13 illustrates a cross section 1300 taken from a four-terminal vertical JFET device in accordance with specific embodiments of the invention disclosed herein. As seen in cross section 1300, the JFET includes a polysilicon gate electrode 1302 formed on a side of mesa 201 and a gate insulator 1301 which isolates the gate electrode 1302 from vertical channel region 213. The resulting device has four terminals because the base contacts 206/207 allow for independent biasing of the base region of the device. The gate electrode 1302 can be contacted out of the plane of cross section 1300.

Figure 14:
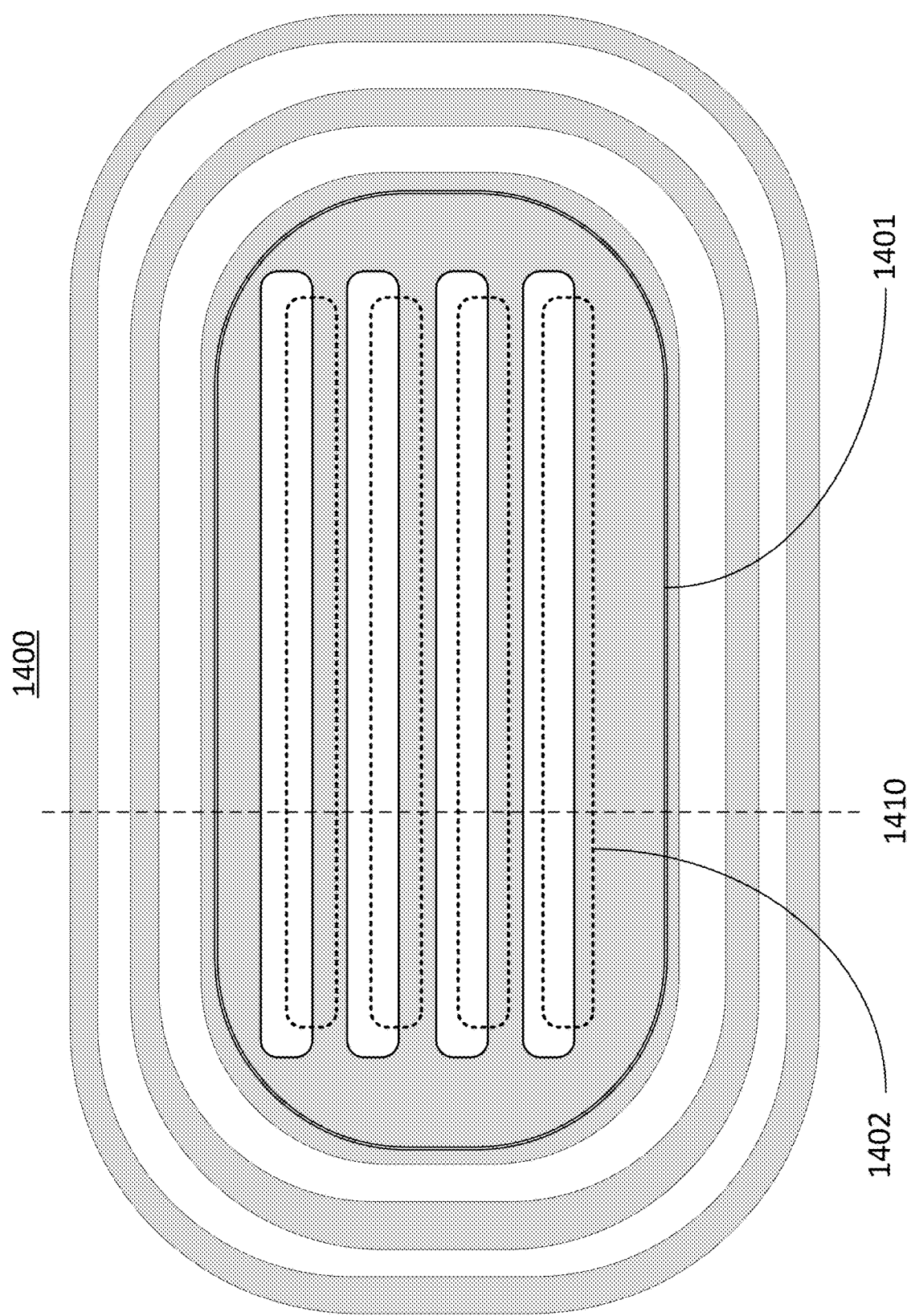
FIG. 14 illustrates plan view of the trenches and implants of a multi-mesa JFET in accordance with specific embodiments of the invention disclosed herein.
Figure 15:
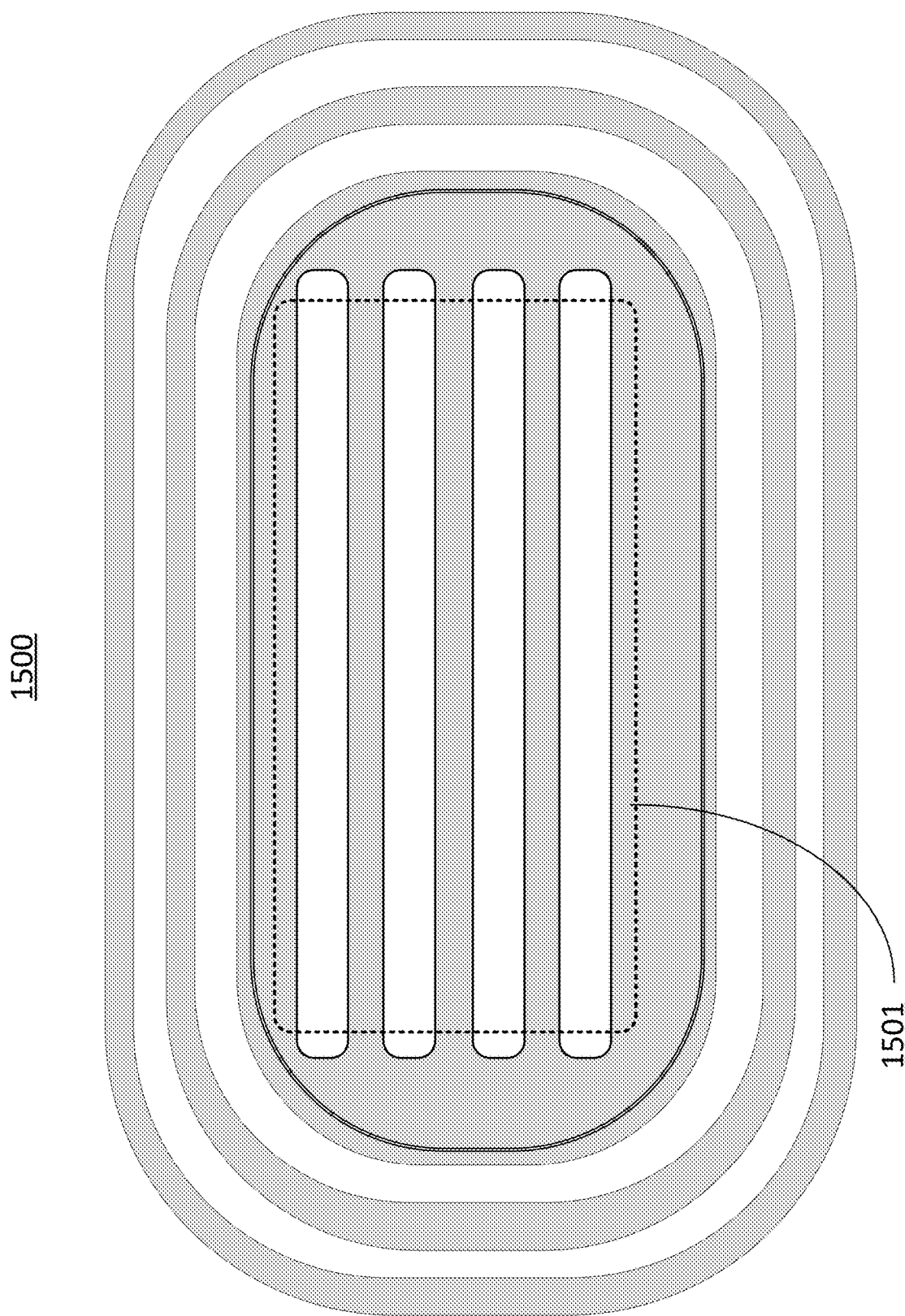
FIG. 15 illustrates an alternative plan view of the trenches and implants of a multi-mesa JFET with a broader source implant region in accordance with specific embodiments of the invention disclosed herein.

FIG. 14 illustrates a plan view 1400 of the trenches and implants of a multi-mesa JFET in accordance with specific embodiments of the invention disclosed herein. The cross sections shown in the other figures in this disclosure can be taken along perpendicular cut line 1410 from any of the illustrated mesas in the mask used to define the source implant region 1401 marked by the solid black line. Trenches in the figure are shown by greyed areas while white areas indicate mesas. The two mesas outside of the source implant mask 1401 can be guard rings for the device. The function of the source implant mask 1401 is to ensure that the mesa guard rings are not implanted by the source implant. More than two mesas can be used to guard and isolate the device. The plan view also shows the outline of the channel mask 1402, used to define the channel region, marked by dotted lines. The channel mask 1402 of each mesa is asymmetrically biased towards one side of the mesa as shown. FIG. 15 illustrates an alternative plan view 1500 of a multi-mesa JFET in accordance with specific embodiments of the invention disclosed herein in which the channel mask 1501 is formed to overlap all mesas except the guard rings. In these embodiments, the channel implant can be a titled implant that results in the channel region only being formed from one side of the mesa.

Figure 16:
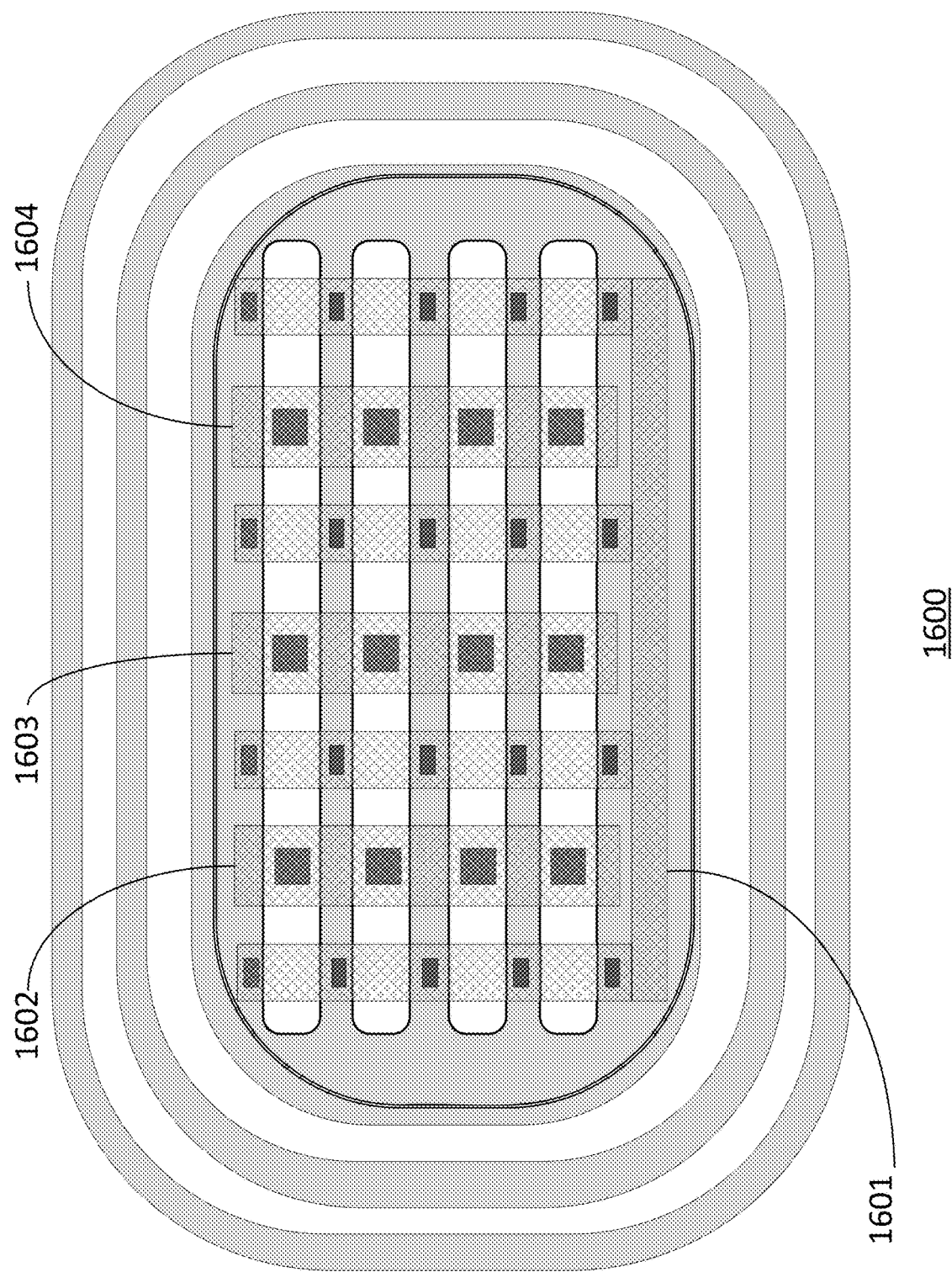
FIG. 16 illustrates a plan view of the first layer of wiring and contacts of a multi-mesa JFET in accordance with specific embodiments of the invention disclosed herein.

FIG. 16 illustrates a plan view 1600 of the first layer of wiring and contacts of a multi-mesa JFET in accordance with specific embodiments of the invention disclosed herein. The wiring could be metal wiring. The plan view shows channel control wiring 1601 commonly connected to the two channel control regions of each mesa where the dark rectangles indicate contacts to active semiconductor material. The plan view also shows three strips of source wiring 1602, 1603, and 1604 which can be commonly connected via a higher-level of wiring or a strip of layer one wiring on the top side of cross section 1600. All the wiring shown in plan view 1600 could be layer one wiring such as the first metal layer in the interconnect layer of a finished device. Notably, the contacts shown in the cross section of FIG. 2 are in the same plane, but this is not true in embodiments represented by plan view 1600 as the source contacts and the channel control contacts are located in different perpendicular cut lines of the mesas.

While the specification has been described in detail with respect to specific embodiments of the invention, it will be appreciated that those skilled in the art, upon attaining an understanding of the foregoing, may readily conceive of alterations to, variations of, and equivalents to these embodiments. For example, although the example of a power transistor was used throughout this disclosure, specific embodiments disclosed herein are more broadly applicable to any JFET. Furthermore, although III-V materials were provided by way of example, specific embodiments disclosed herein are broadly applicable to any form of semiconductor technology. These and other modifications and variations to the present invention may be practiced by those skilled in the art, without departing from the scope of the present invention, which is more particularly set forth in the appended claims.

What is claimed is:

1. A junction field effect transistor (FET) comprising:
an implanted vertical channel region located in a mesa, wherein the implanted vertical channel region is an only channel region in the mesa and is asymmetrically disposed in the mesa;
a first channel control region located vertically along a first side of the mesa, wherein the first channel control region is at least one of a gate region and a first base region; and
a second base region located vertically along a second side of the mesa and extending through the mesa to contact the implanted vertical channel region,
wherein the implanted vertical channel region is located between the first channel control region and the second base region within the mesa.

2. The junction FET of claim 1, further comprising:
a source layer located on a top side of the mesa;
a drain layer located below the mesa; and
wherein the implanted vertical channel region provides a conductive path between the drain layer and the source layer when the junction FET is on.

3. The junction FET of claim 2, further comprising:
a drift layer located between the implanted vertical channel and the drain layer.

4. The junction FET of claim 3, wherein:
the implanted vertical channel region contacts the source layer and the drift layer.

5. The junction FET of claim 1, wherein:
the second base region has a low doped portion and a high doped portion;
the high doped portion is located on the second side of the mesa;
the low doped portion extends from the high doped portion through the mesa to contact the implanted vertical channel region; and
the low doped portion is located within the mesa between the implanted vertical channel region and the high doped portion.

6. The junction FET of claim 5, wherein:
the low doped portion has a dopant concentration from 1e15 to 3e16 particles per centimeter cubed; and
the high doped portion has a dopant concentration from 1e17 to 1e19 particles per centimeter cubed.

7. The junction FET of claim 6, wherein:
the high doped portion is an implanted base portion formed on the second side of the mesa.

8. The junction FET of claim 1, wherein:
the channel width of the junction FET is equal to the channel width of the implanted vertical channel region.

9. The junction FET of claim 1, wherein:
the implanted vertical channel region is closer to the first side of the mesa than the second side of the mesa;
the first channel control region is a first base region which contacts the implanted vertical channel region; and
the second base region contacts the implanted vertical channel region.

10. The junction FET of claim 9, wherein:
the second base region has a dopant concentration from 1e17 to 1e19 particles per centimeter cubed; and
the second base region is an implanted base region formed on the second side of the mesa.

11. The junction FET of claim 1, wherein:
the first channel control region is the first base region; and
the implanted vertical channel region, the first base region, and the second base region are all formed in silicon carbide.

12. The junction FET of claim 1, wherein the first channel control region is the vertical gate region, and wherein vertical gate region comprises:
a vertical polysilicon gate electrode formed on the first side of the mesa; and
a gate insulator formed on the first side of the mesa;
wherein the gate insulator isolates the vertical polysilicon gate electrode from the implanted vertical channel.

13. A junction field effect transistor comprising:
a vertical channel region located in a mesa, the vertical channel region being an only channel region in the mesa and is asymmetrically located in the mesa;
a first channel control region located vertically along a first side of the mesa, wherein the first channel control region is at least one of a gate region and a first base region; and
a second base region having a low doped portion and a high doped portion, wherein the high doped portion is located vertically along a second side of the mesa,
wherein the low doped portion extends from the high doped portion to contact the vertical channel region, the low doped portion is located between the vertical channel region and the high doped portion within the mesa, and the vertical channel region is located between the first channel control region and the second base region within the mesa.

* * * * *